(12) United States Patent
Kim et al.

(10) Patent No.: US 11,742,342 B2
(45) Date of Patent: Aug. 29, 2023

(54) FINFET ESD DEVICE WITH FIN-CUT ISOLATION REGION

(71) Applicant: SAMSUNG ELECTRONICS CO., LTD., Suwon-si (KR)

(72) Inventors: Sukjin Kim, Seoul (KR); Mijin Lee, Yongin-si (KR); Chanhee Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 184 days.

(21) Appl. No.: 17/144,354

(22) Filed: Jan. 8, 2021

(65) Prior Publication Data

US 2021/0384188 A1 Dec. 9, 2021

(30) Foreign Application Priority Data

Jun. 9, 2020 (KR) .......................... 10-2020-0069849

(51) Int. Cl.
*H01L 27/02* (2006.01)

(52) U.S. Cl.
CPC ................................ *H01L 27/0255* (2013.01)

(58) Field of Classification Search
CPC .............. H01L 27/0255; H01L 29/785; H01L 27/0248; H01L 27/0292; H01L 27/0296; H01L 29/861; H01L 29/66136; H01L 27/2409
See application file for complete search history.

(56) References Cited

U.S. PATENT DOCUMENTS

| 9,117,669 | B2 * | 8/2015 | Lin ................... H01L 29/66136 |
| 9,318,621 | B2 | 4/2016 | Chang et al. |
| 9,620,587 | B2 | 4/2017 | Singh et al. |
| 10,008,491 | B1 | 6/2018 | Li et al. |
| 10,032,764 | B2 | 7/2018 | Lin et al. |
| 10,109,621 | B2 | 10/2018 | Lee |
| 10,510,776 | B2 | 12/2019 | Liu et al. |

FOREIGN PATENT DOCUMENTS

| CN | 107039415 A | 8/2017 |
| CN | 110518008 A | 11/2019 |
| WO | 2018004683 A1 | 1/2018 |
| WO | 2019143340 A1 | 7/2019 |

\* cited by examiner

*Primary Examiner* — Wasiul Haider
(74) *Attorney, Agent, or Firm* — Sughrue Mion, PLLC

(57) ABSTRACT

An electrostatic discharge (ESD) device having a small size, a low turn-on voltage, and a low on resistance and an ESD protection circuit including the ESD device are provided. The ESD device includes a well formed in a substrate to have a first conductive type, an active region being defined at an upper portion of the substrate, a plurality of fins extending in a first direction to have a structure protruding from the substrate, a first conductive impurity region formed with first conductive impurities, a second conductive impurity region formed with second conductive impurities, and a fin-cut isolation region disposed between the first conductive impurity region and the second conductive impurity region in the first direction to cut each fin, wherein a bottom surface of the fin-cut isolation region is higher than a bottom surface of the active region.

21 Claims, 23 Drawing Sheets

FINFET ESD DEVICE WITH FIN-CUT ISOLATION REGION

CROSS-REFERENCE TO THE RELATED APPLICATION

This application is based on and claims priority under 35 U.S.C. § 119 to Korean Patent Application No. 10-2020-0069849, filed on Jun. 9, 2020, in the Korean Intellectual Property Office, the disclosure of which is incorporated by reference herein in its entirety.

BACKGROUND

The inventive concept relates to an electrostatic discharge (ESD) device, and particularly, to an ESD device including a fin structure and an ESD protection circuit including the ESD device.

Semiconductor devices may be exposed to static electricity having an instantaneous voltage of 3,000 V due to various causes. When a semiconductor device is exposed to static electricity, a gate insulation layer of a transistor of the semiconductor device may be broken down or bond spiking may occur in a metal-silicon bond of the transistor, causing the breakdown or damage of the semiconductor device. Due to this, static electricity may adversely affect the reliability of semiconductor devices. An ESD device or an ESD protection circuit is applied to electronic devices for preventing semiconductor devices from being damaged by static electricity. However, as electronic devices are highly integrated recently, a chip size is progressively reduced and thus research is conducted for decreasing a size of an ESD device or an ESD protection circuit while maintaining a tolerance to static electricity.

SUMMARY

The inventive concept provides an electrostatic discharge (ESD) device having a small size, a low turn-on voltage, and a low on resistance and an ESD protection circuit including the ESD device.

According to an aspect of the disclosure, there is provided an electrostatic discharge (ESD) device comprising: a well formed in a substrate, the well having a first conductive type, and having an active region formed at an upper portion of the substrate; a plurality of fins extending in a first direction across the well in a protruding manner from the substrate, the plurality of fins being spaced apart from one another in a second direction perpendicular to the first direction; a first conductive impurity region formed by doping a portion of each of the plurality of fins with first conductive impurities; a second conductive impurity region formed by doping a portion of each of the plurality of fins with second conductive impurities having a second conductive type different from the first conductive type, the second conductive impurity region being disposed apart from the first conductive impurity region in the first direction; and a fin-cut isolation region disposed between the first conductive impurity region and the second conductive impurity region in the first direction in each of the plurality of fins to cut each of the plurality of fins into at least a first fin portion and a second fin portion, wherein a bottom surface of the fin-cut isolation region is higher than a bottom surface of the active region.

According to an aspect of the disclosure, there is provided an electrostatic discharge (ESD) device comprising: a well formed in a substrate, the well having a first conductive type; a plurality of fins extending in a first direction across the well in a protruding manner from the substrate, the plurality of fins being spaced apart from one another in a second direction perpendicular to the first direction; a first conductive impurity region formed by doping a portion of each of the plurality of fins with first conductive impurities; a second conductive impurity region formed by doping a portion of each of the plurality of fins with second conductive impurities having a second conductive type different from to the first conductive type, the second conductive impurity region being disposed apart from the first conductive impurity region in the first direction; a fin-cut isolation region disposed between the first conductive impurity region and the second conductive impurity region in the first direction in each of the plurality of fins to cut the each of the plurality of fins into at least a first fin portion and a second fin portion; a plurality of gate lines disposed apart from one another in the first direction to cover a portion of each of the plurality of fins and extend in the second direction; and a contact contacting each of the first conductive impurity region and the second conductive impurity region, wherein an active region is formed at an upper portion of the well, and wherein a first portion of the active region under the first fin portion and a second portion of the active region under the second fin portion are connected to each other through a third portion of the active region under the fin-cut isolation region.

According to another aspect of the disclosure, there is provided an electrostatic discharge (ESD) protection circuit comprising: at least two ESD devices provided on a substrate; and a pad provided on the substrate and connected to the at least two ESD devices, and configured to apply a signal voltage to a protection target device protected by the at least two ESD devices, wherein each of the at least two ESD devices comprises: a well formed in the substrate, the well having a first conductive type, and having an active region formed at an upper portion of the substrate; a plurality of fins extending in a first direction across the well in a protruding manner from the substrate, the plurality of fins being spaced apart from one another in a second direction perpendicular to the first direction; a first conductive impurity region formed by doping a portion of each of the plurality of fins with first conductive impurities; a second conductive impurity region formed by doping a portion of each of the plurality of fins with second conductive impurities having a second conductive type different from the first conductive type, the second conductive impurity region being disposed apart from the first conductive impurity region in the first direction; and a fin-cut isolation region disposed between the first conductive impurity region and the second conductive impurity region in the first direction in each of the plurality of fins to cut each of the plurality of fins into at least a first fin portion and a second fin portion, wherein a bottom surface of the fin-cut isolation region is higher than a bottom surface of the active region.

According to an aspect of the disclosure, there is provided a method of manufacturing an electrostatic discharge (ESD) device, the method comprising: forming a well having a first conductive type in a substrate; forming an active region at an upper portion of the substrate; providing a plurality of fins extending in a first direction across the well in a protruding manner from the substrate, the plurality of fins being spaced apart from one another in a second direction perpendicular to the first direction; doping a portion of each of the plurality of fins with first conductive impurities to form a first conductive impurity region; doping a portion of each of the plurality of fins with second conductive impurities having a second conductive type different from the first conductive type to form a second conductive impurity region, the second conductive impurity region being disposed apart from the first conductive impurity region in the first direction; and cutting each of the plurality of fins into at least a first fin portion and a second fin portion, and forming a fin-cut isolation region disposed between the first conductive impurity region and the second conductive impurity region in the first direction in each of the plurality of fins, wherein a bottom surface of the fin-cut isolation region is higher than a bottom surface of the active region.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, example embodiments will be described in detail with reference to the accompanying drawings. Like numeral references refer to like elements, and their repetitive descriptions are omitted.

Figure 1:
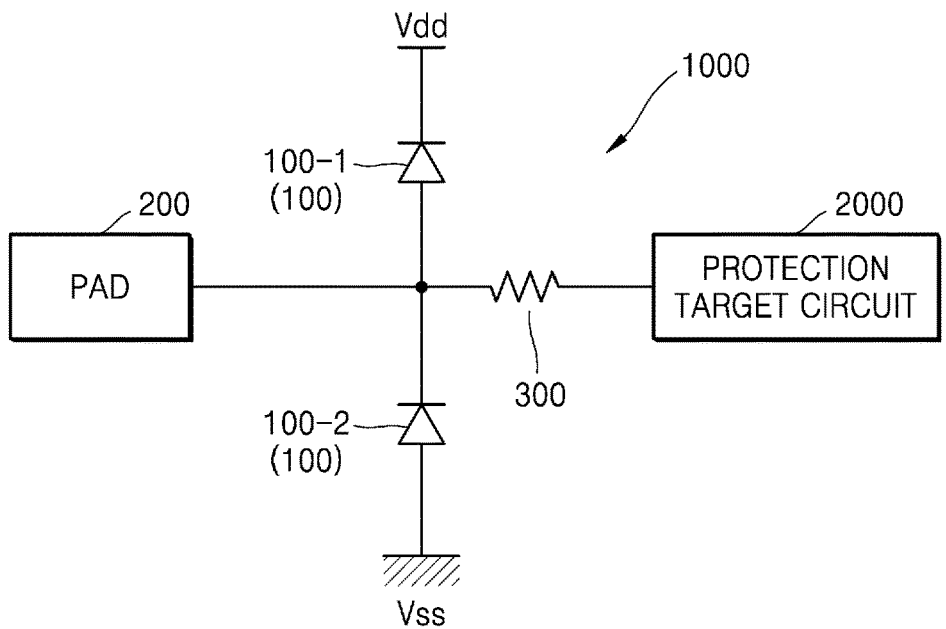
FIG. 1 is an equivalent circuit diagram of an electrostatic discharge (ESD) protection circuit according to an example embodiment.

FIG. 1 is an equivalent circuit diagram of an electrostatic discharge (ESD) protection circuit 1000 according to an embodiment.

Referring to FIG. 1, the ESD protection circuit 1000 according to an embodiment may include an ESD device 100 and a pad 200. The ESD device 100 and the pad 200 may be formed on a substrate (see 101 of FIG. 3B) along with a protection target device 2000. A signal voltage may be applied to the protection target device 2000 through the pad 200.

According to an example embodiment, the ESD device 100 may include at least two ESD devices, for example, a first ESD device 100-1 and a second 100-2. According to an example embodiment, the first ESD device 100-1 of the ESD device 100 may have a P-type diode structure and the second ESD device 100-2 of the ESD device 100 may have an N-type diode structure. However, the disclosure is not limited thereto, and the first ESD device 100-1 of the ESD device 100 may have a N-type diode structure and the second ESD device 100-2 of the ESD device 100 may have an P-type diode structure. According to an example embodiment, the ESD device 100 may include a plurality of first ESD devices 100-1 and a plurality of second ESD devices 100-2. The plurality of first ESD devices 100-1 may be connected to one another in parallel, and the plurality of second ESD devices 100-2 may be connected to one another in parallel.

According to an example embodiment, the ESD device 100 may include a fin structure and may include a fin-cut isolation region (see FC of FIGS. 3A to 3D) for junction separation between an anode and a cathode. Therefore, since the ESD device 100 includes the fin structure and the fin-cut isolation region FC, the ESD device 100 may have a small size, a low turn-on voltage, and a low on resistance. A detailed structure of the ESD device 100 and various example embodiments will be described in more detail with respect to FIGS. 3A-3D, 5-9, 10A-10C and 11. Also, detailed descriptions of a circuit connection relationship and a function of the ESD protection circuit 1000 will be described with respect to FIGS. 3A-3D, 5-9, 10A-10C and 11.

According to an example embodiment, the pad 200 may be connected to an anode terminal of the first ESD device 100-1 of the ESD protection circuit 1000, and a source voltage Vdd may be connected to a cathode terminal of the first ESD device 100-1. Moreover, a ground voltage Vss may be connected to an anode terminal of the second ESD device 100-2 of the ESD protection circuit 1000, and the pad 200 may be connected to a cathode terminal of the second ESD device 100-2. As a result, the pad 200 may be connected to the anode terminal of the first ESD device 100-1 and the cathode terminal of the second ESD device 100-2 in common. Moreover, the pad 200 may be connected to the protection target device 2000 so as to apply the signal voltage to the protection target device 2000.

When sudden static electricity occurs, the ESD protection circuit 1000 having such a structure in FIG. 1 may protect the protection target device 2000 through the following operation. That is, when positive (+) static electricity is applied, the positive (+) static electricity may flow in a forward direction of the first ESD device 100-1 and may be discharged to a terminal with the source voltage Vdd applied thereto, and when negative (−) static electricity is applied, the negative (−) static electricity may flow in a forward direction of the second ESD device 100-2 and may be discharged to a terminal with the ground voltage Vss applied thereto. Here, a concept of protecting the protection target device 2000 through the ESD protection circuit 1000 may be understood as a concept where an ESD current path is formed only between the pad 200 and a source voltage Vdd terminal or between the pad 200 and a ground voltage Vss terminal and is not formed toward the protection target device 2000, namely, a current of static electricity does not flow to the protection target device 2000.

As a result, the ESD protection circuit 1000 may include the ESD device 100, and thus, only when instantaneous static electricity occurs, the static electricity may be discharged through the ESD device 100, thereby protecting the protection target device 2000 from the static electricity. As illustrated in FIG. 1, in order to more safely protect the protection target device 2000 from static electricity, a resistance device 300 having an appropriate-level resistance may be added to a front end with respect to the protection target device 2000. The resistance device 300 may be provided as an element of the protection target device 2000. However, according to an embodiment, considering a function of the resistance device 300, the resistance device 300 may be provided as an element of the ESD protection circuit 1000.

The protection target device 2000 may include various kinds of electronic devices which need protection from static electricity. For example, the protection target device 2000 may include various memory devices such as dynamic random access memory (DRAM) and flash memory, a logic device configuring a controller, and various semiconductor devices such as an interface device for data communication. According to an example embodiment, the ESD protection circuit 1000 may include a fin field effect transistor (FinFET) structure, and based thereon, the protection target device 2000 may also include a semiconductor device including FinFETs. That is, the ESD protection circuit 1000 and the protection target device 2000 may be simultaneously formed on a substrate through a FinFET process.

According to an example embodiment, based on an ESD characteristic of the protection target device 2000, a model where the protection target device 2000 is damaged may be classified into a human body model (HBM) and a charged device model (CDM). Here, the HBM may denote a case where an electrified person causes static electricity in the protection target device 2000 to damage the protection target device 2000, and the CDM may denote a case where the protection target device 2000 is electrified, and the protection target device 2000 causes static electricity in a conductor such as a human body or metal to damage the protection target device 2000. The ESD protection circuit 1000 according to an example embodiment may be used for all of the HBM and the CDM.

According to an example embodiment, the ESD device 100 may include a P-type impurity region and an N-type impurity region each having a fin structure and may include a fin-cut isolation region for junction separation between the P-type impurity region and the N-type impurity region, and thus, may have a small size, a low turn-on voltage, and a low on resistance. Therefore, according to an example embodiment, the ESD protection circuit 1000 including the ESD device 100 having such a structure may enable the implementation of an ESD protection circuit with an excellent power performance area (PPA). Thus, a very reliable electronic device including the ESD protection circuit may be provided.

FIGS. 2A-2D are plan views illustrating a shape of an impurity region of an ESD device in the ESD protection circuit 1000 of FIG. 1.

Figure 2A:
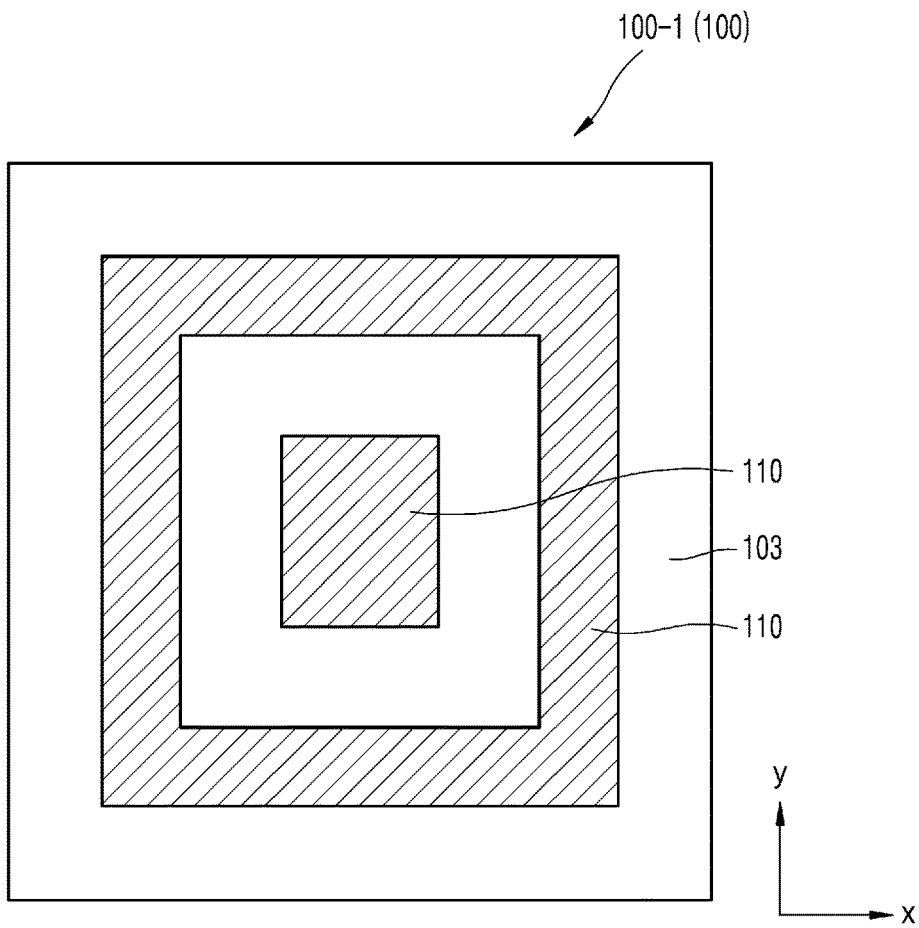
FIGS. 2A-2D are plan views illustrating a shape of an impurity region of an ESD device in the ESD protection circuit of FIG. 1.
Figure 2B:
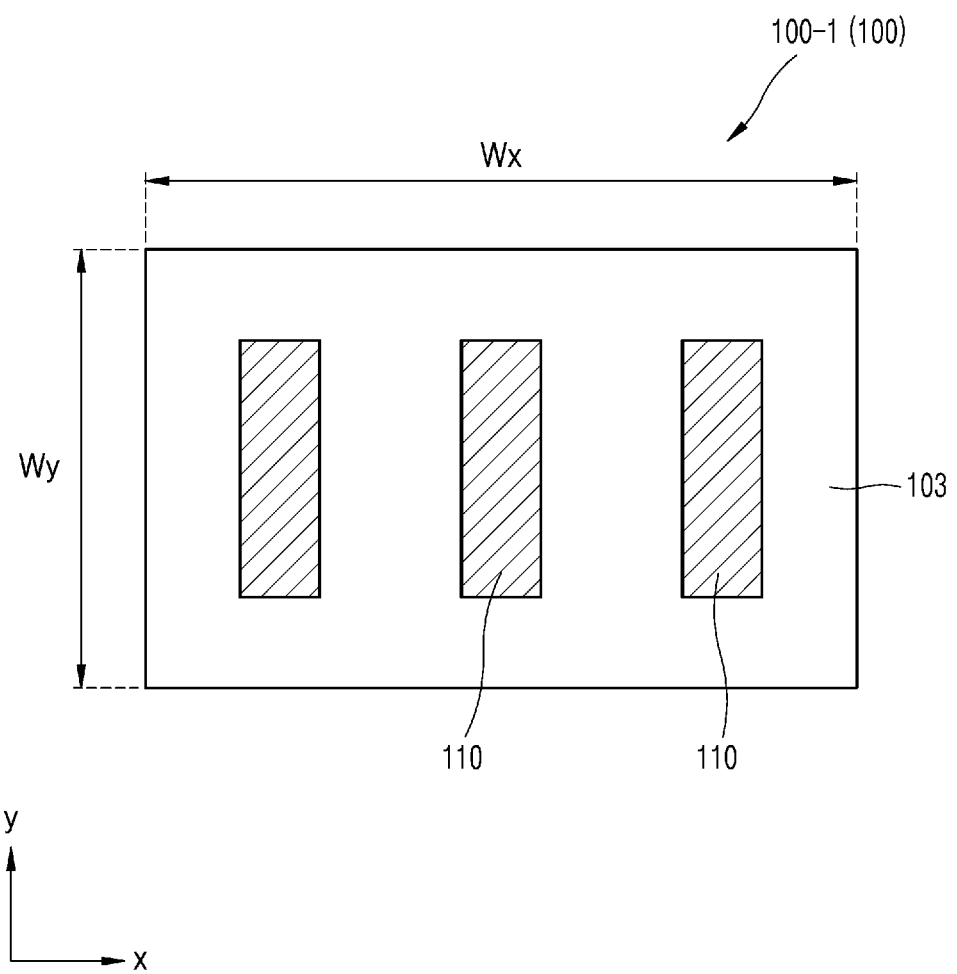

Referring to FIG. 2A, an ESD device 100 according to an example embodiment may include a first ESD device 100-1 having a P-type diode structure, and the first ESD device 100-1 may include a plurality of impurity regions 110 and a well 10. Referring to FIG. 2B, an ESD device 100 according to another example embodiment may include a second ESD device 100-2 having an N-type diode structure, and the second ESD device 100-2 may include a plurality of impurity regions 120 and a well 103. Here, the plurality of impurity regions 110 and 120 may denote, for example, a P+ region or an N+ region where P-type impurities or N-type impurities are doped at a high concentration of $10^{19}/cm^3$ or more. As illustrated, the first ESD device 100-1 or the second ESD device 100-2 may have a ring-type structure where an external impurity region 120 or 110 surrounds an internal impurity region 110 or 120 in a tetragonal ring shape. For example, the first ESD device 100-1 may have a structure where a P-type impurity region 110 is disposed at an internal center thereof and an external N-type impurity region 120 surrounds the P-type impurity region 110 in a tetragonal ring shape. Moreover, the second ESD device 100-2 may have a structure where an N-type impurity region 120 is disposed at an internal center thereof and an external P-type impurity region 110 surrounds the N-type impurity region 120 in a tetragonal ring shape.

The well 103 may be an N-type well. The well 103 may be, for example, an N-region where N-type impurities are doped at a concentration of $10^{16}/cm^3$ or less. The P-type impurity region 110 and the well 103 may have different conductive types of impurities, and thus, may form a PN junction. A shape of a vertical cross-sectional surface of each of the impurity regions 110 and 120 and the well 103 may be seen in FIGS. 3B to 3D. For example, the impurity regions 110 and 120 may be disposed at an upper portion of the well 103. The impurity regions 110 and 120 and the upper portion of the well 103 may be defined as an active region (see ACT of FIGS. 3A to 3D). The upper portion of the well 103 configuring the active region ACT may be, for example, an NO region which is doped with N-type impurities at a concentration of $10^{16}/cm^3$ or more and is higher in doping concentration than an N− region.

In FIGS. 2A and 2B, the impurity regions 110 and 120 of the ESD device 100 may have an internal square shape and an external square ring shape, but shapes of the impurity regions 110 and 120 of the ESD device 100 are not limited thereto. For example, the impurity regions 110 and 120 of the ESD device 100 may have an internal rectangular shape and an external rectangular ring shape, or may have an internal oval shape and an external oval ring shape.

Figure 2C:
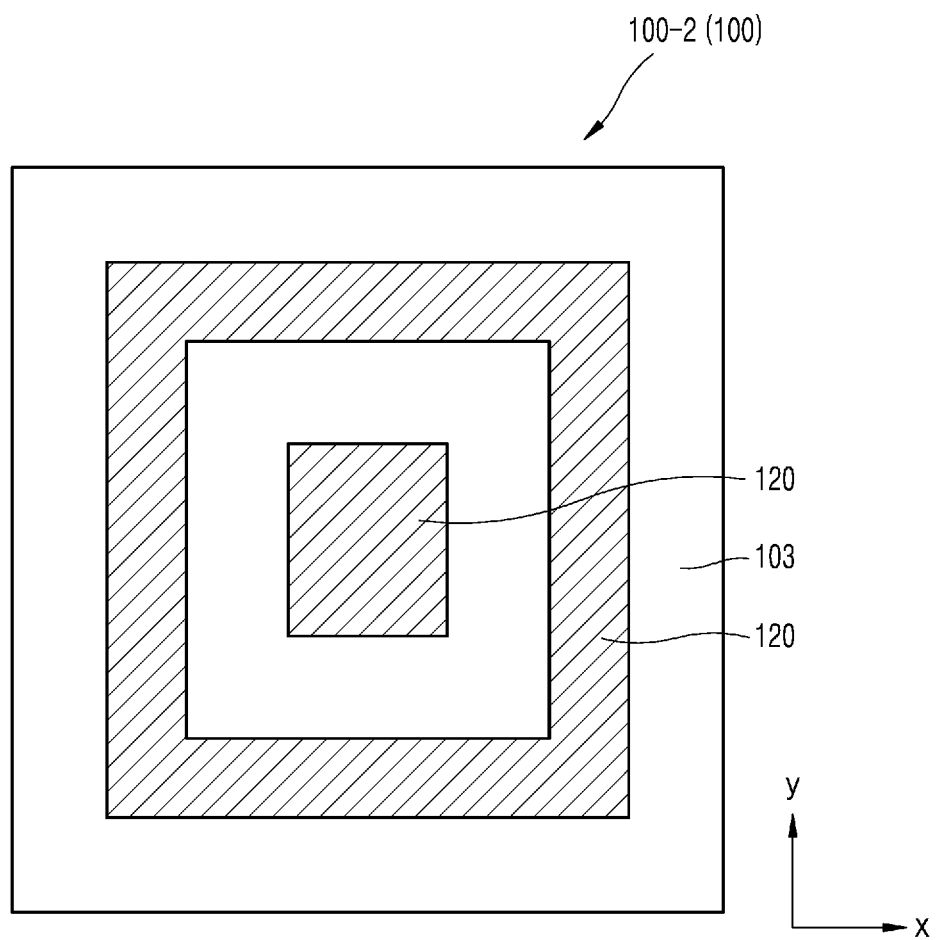
Figure 2D:
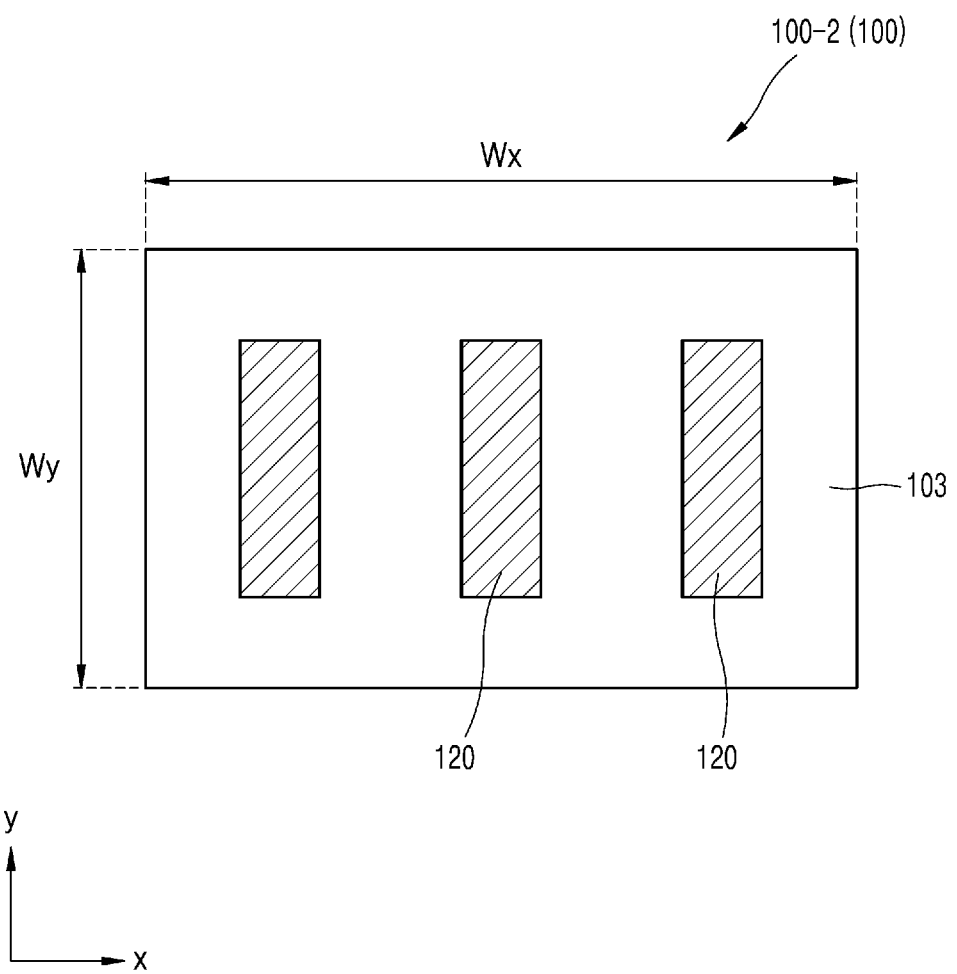

Referring to FIG. 2C, an ESD device 100 according to an example embodiment may include a first ESD device 100-1 having a P-type diode structure and the first ESD device 100-1 may include a plurality of impurity regions 110 and a well 103. Referring to FIG. 2D, an ESD device 100 according to another example embodiment may include a second ESD device 100-2 having an N-type diode structure and the second ESD device 100-2 may include a plurality of impurity regions 120 and a well 103. As illustrated, each of the first ESD device 100-1 and the second ESD device 100-2 may have a bar-type structure having a bar shape where the impurity regions 110 and 120 extend in a second direction (the y direction) and are apart from each other in a first direction (the x direction). For example, in the first ESD device 100-1, a P-type impurity region 110 may be disposed at a center portion of the first ESD device 100-1 in a bar shape which extends in the second direction (the y direction), and an N-type impurity region 120 may be disposed at both outer portions of the P-type impurity region 110 in a bar shape which extends in the second direction (the y direction). Also, in the second ESD device 100-2, an N-type impurity region 120 may be disposed at a center portion of the second ESD device 100-2 in a bar shape which extends in the second direction (the y direction), and a P-type impurity region 110 may be disposed at both outer portions of the N-type impurity region 120 in a bar shape which extends in the second direction (the y direction).

In the ESD device 100 having a bar type, based on a planar structure of the well 103 including the impurity regions 110 and 120, a width Wx of the ESD device 100 in the first direction (the x direction) and a width Wy of the ESD device 100 in the second direction (the y direction) may be defined, and an area of the ESD device 100 may be defined by a multiplication (i.e., Wx*Wy) of the width Wx of the ESD device 100 in the first direction (the x direction) by the width Wy of the ESD device 100 in the second direction (the y direction). Also, a horizontal area of the impurity region 110 or 120 disposed at the center portion of the ESD device 100 may be defined as an effective area of the ESD device 100. Furthermore, in the ESD device 100 of a ring-type of FIGS. 2A and 2B, an area of the ESD device 100 may be defined by a total area of the well 103, and the effective area of the ESD device 100 may be defined by the horizontal area of the impurity region 110 or 120 disposed at the center portion of the ESD device 100. The widths Wx and Wy, area, and effective area of the ESD device 100 will be described in more detail with reference to the graph of FIG. 4.

Figure 3A:
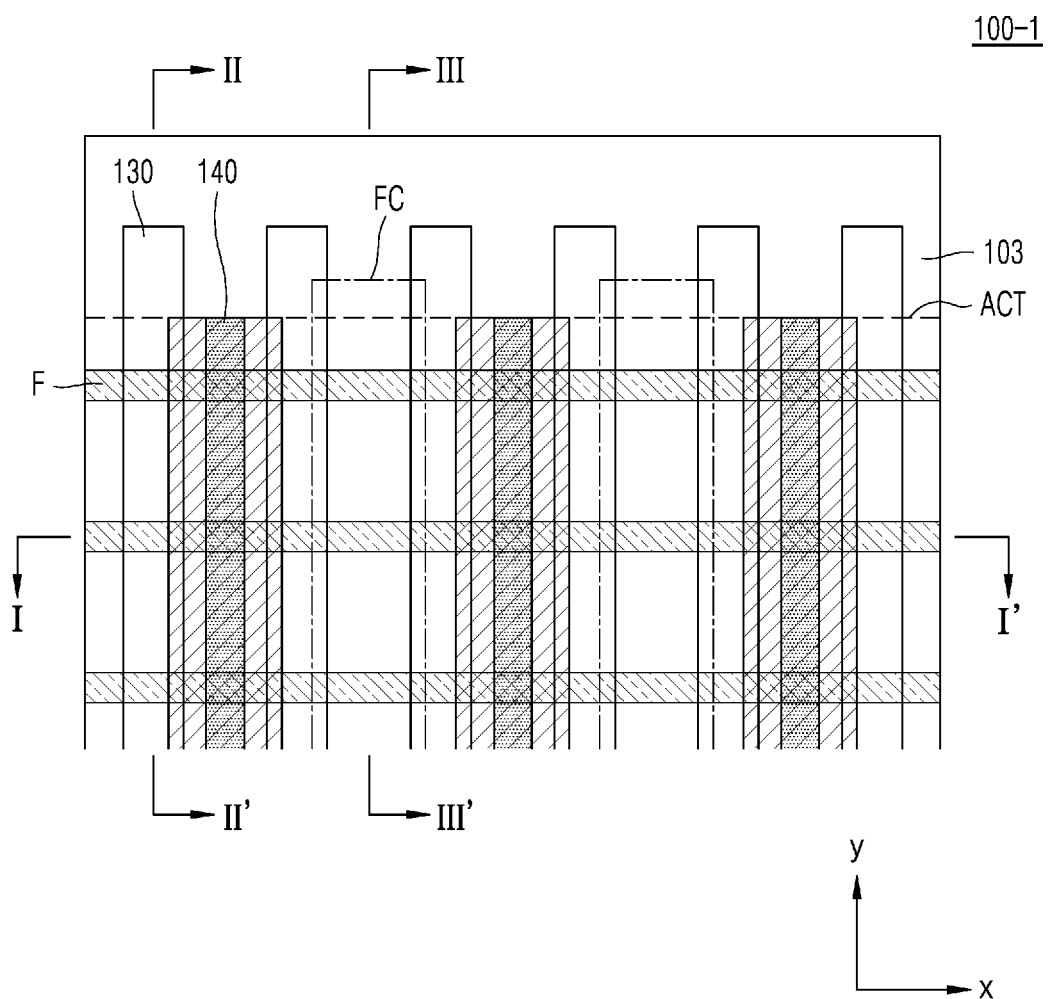
FIG. 3A is a plan view of an ESD device having a P-type diode structure in the ESD protection circuit of FIG. 1.
Figure 3B:
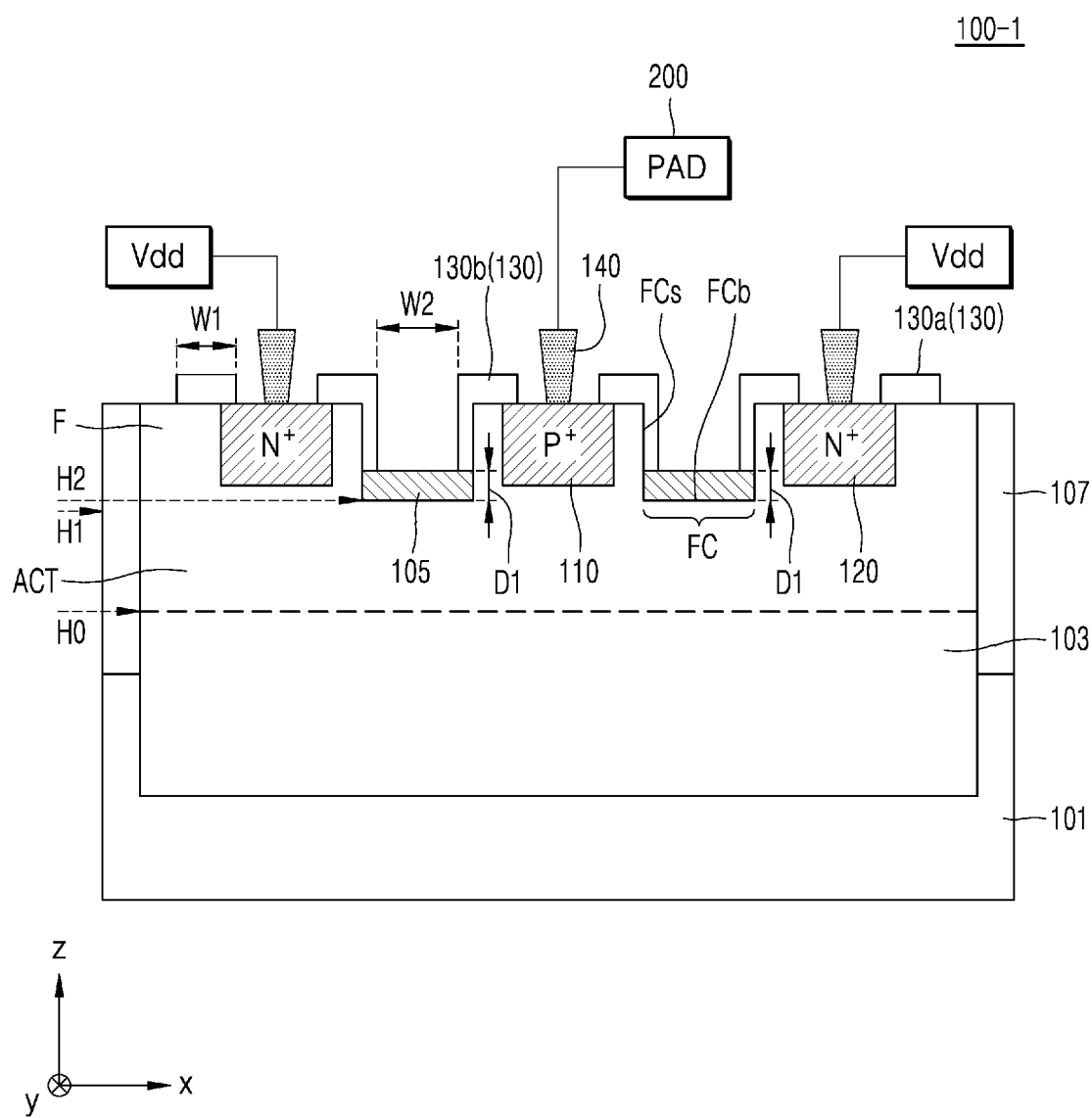
FIG. 3B is a cross-sectional view along I-I' in FIG. 3A.
Figure 3C:
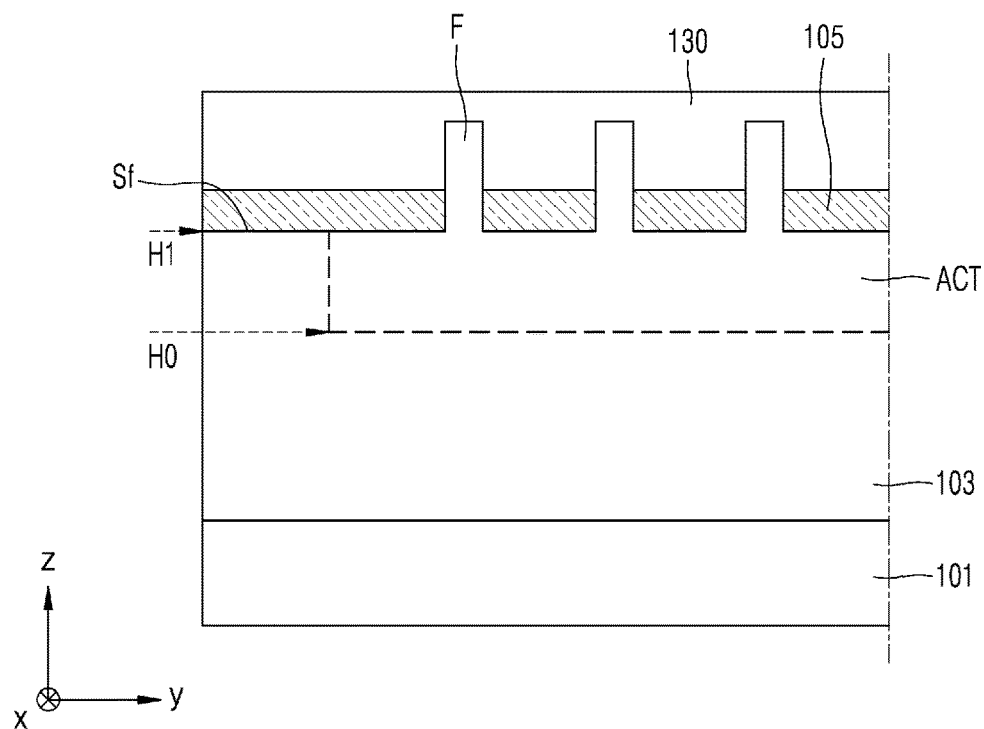
FIG. 3C is a cross-sectional view along II-II' in FIG. 3A.
Figure 3D:
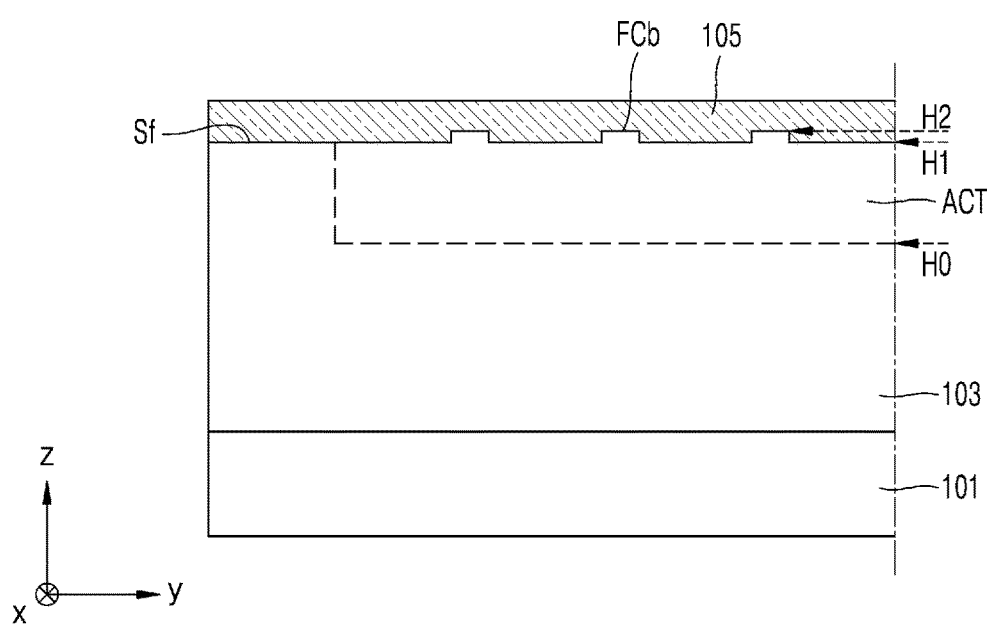
FIG. 3D is a cross-sectional view along III-III' in FIG. 3A.

FIGS. 3A to 3D are a plan view and cross-sectional views of an ESD device having a P-type diode structure in the ESD protection circuit of FIG. 1. FIG. 3B is a cross-sectional view taken along line I-I' of FIG. 3A, FIG. 3C is a cross-sectional view taken along line II-II' of FIG. 3A, and FIG. 3D is a cross-sectional view taken along line III-III' of FIG. 3A. Descriptions given above with reference to FIGS. 1 and 2A-2D are omitted or will be briefly given below.

Referring to FIGS. 3A to 3D, an ESD device 100-1 according to an example embodiment may include a substrate 101, a well 103, a fin F, a P-type impurity region 110, an N-type impurity region 120, a fin-cut isolation region FC, a gate line 130, and a contact 140. As seen in FIG. 3A, the ESD device 100-1 according to an example embodiment may have a bar-type structure. However, the ESD device 100-1 according to an example embodiment is not limited to the bar-type structure. For example, the ESD device 100-1 according to an example embodiment may have a ring-type structure.

The substrate 101 may be, for example, a P-type substrate. The well 103 may be formed in the substrate 101, and as described above, may be an N-type well. The well 103 may be formed at an upper portion of the substrate 101 and may be differentiated from other peripheral devices by an isolation structure 107 defining the well 103. Here, the other devices may include other ESD devices configured as an ESD protection circuit (see 1000 of FIG. 1) and may include a protection target device (see 2000 of FIG. 1) protected by the ESD protection circuit 1000. An active region ACT may be defined at an upper portion of the well 103.

A plurality of fins F may be formed on the substrate 101. The plurality of fins F may have a structure which protrudes from the substrate 101 and may be apart from one another in a second direction (the y direction in FIG. 3A) to extend in a first direction (the x direction). Referring to FIG. 3C, a bottom surface of the fin F may correspond to a top surface Sf of the substrate 101 and may have a first height H1. A bottom surface of the active region ACT of the well 103 may have a base height H0 and may be lower than the first height H1.

The P-type impurity region 110 may be formed at an upper portion of the fin F. Also, the P-type impurity region 110 may be disposed at a center portion of the fin F in the first direction (the x direction). The N-type impurity region 120 may also be formed at the upper portion of the fin F. The N-type impurity region 120 may be disposed at an outer portion of the fin F in the first direction (the x direction). That is, the N-type impurity region 120 may be disposed at outer portions on either side of the P-type impurity region 110. Therefore, the ESD device 100-1 according to an example embodiment may have a P-type diode structure.

In the ESD device 100-1 according to an example embodiment, the P-type impurity region 110 and the N-type impurity region 120 may be formed at the upper portion of the fin F. However, a range of each of the P-type impurity region 110 and the N-type impurity region 120 is not limited thereto. For example, according to an embodiment, the P-type impurity region 110 and the N-type impurity region 120 may be formed to extend from the upper portion of the fin F to a lower portion of the fin F or from the upper portion of the fin F to an upper portion of the active region ACT.

The fin-cut isolation region FC may be formed to extend in the second direction (the y direction). The fin-cut isolation region FC may cut the fin F to isolate the P-type impurity region 110 from the N-type impurity region 120 in the first direction (the x direction). That is, the fin-cut isolation region FC may be between the P-type impurity region 110 and the N-type impurity region 120 in the first direction (the x direction). A lower portion of the fin-cut isolation region FC may be filled with an isolation insulation layer 105. Moreover, as seen in FIGS. 3C and 3D, the isolation insulation layer 105 may be formed all over a top surface, of the substrate 101 as well as the fin-cut isolation region FC, except the top surface of fin F. That is, the isolation insulation layer 105 may be formed between the fins F and on the substrate 101 corresponding to an outer portion of the fin F in the second direction (the y direction).

A bottom surface FCb of the fin-cut isolation region FC may have a second height H2. As seen in FIG. 3D, the second height H2 may be higher than the first height H1, which is a height of a top surface Sf of the substrate 101. However, according to an example embodiment, a thickness by which a fin is removed may vary in a fin-cut process, and thus, a height of the bottom surface FCb of the fin-cut isolation region FC may vary. The bottom surface FCb of the fin-cut isolation region FC will be described in more detail with reference to FIGS. 7 and 8.

For reference, in an ESD device of the related art, a shallow trench isolation (STI) structure or a deep trench isolation (DTI) structure may be formed for junction separation between the P-type impurity region 110 and the N-type impurity region 120. The STI or DTI structure may be fundamentally formed by a depth which enables division of the active region ACT. Therefore, a bottom surface of the STI or DTI structure may be lower than the base height H0, which is a bottom surface of the active region ACT. Here, the STI structure and the DTI structure may be differentiated from each other by performing a trench forming process once or more, and the DTI structure on which the trench process is performed twice or more may be deeper than the STI structure on which the trench process is performed once.

On the other hand, in the ESD device 100-1 according to an example embodiment, the fin-cut isolation region FC may be formed by removing only the fin F, and thus, all or a portion of the active region ACT under the fin F may be maintained. According to an example embodiment, the fin-cut isolation region FC may be formed by removing only a portion of the fin F. Therefore, the ESD device 100-1 according to an example embodiment may have a structure where fins F adjacent to one another in the first direction (the x direction) are connected to one another through the active region ACT thereunder, and for example, may have a structure where the active region ACT is merged.

A plurality of gate lines 130 may be formed on the substrate 101. The plurality of gate lines 130 may extend in the second direction (the y direction) to cover a portion of the fin F and may be apart from the first direction (the x direction). As illustrated in FIG. 3B, the gate line 130 may include a first gate line 130a, which is disposed on only the fin F in the first direction (the x direction), and a second gate line 130b, which is disposed at a portion which corresponds to the fin F and the fin-cut isolation region FC. The first gate line 130a may cover a top surface of the fin F and both side surfaces of the fin F in the second direction (the y direction). The second gate line 130b may cover the top surface of the fin F, one side surface of the fin F in the first direction (the x direction), and both side surfaces of the fin F in the second direction (the y direction). Here, the one side surface of the fin F in the first direction (the x direction) may correspond to one side surface FCs of the fin-cut isolation region FC.

The gate line 130 may have a first width W1 in the first direction (the x direction). The first width W1 may be, for example, about 70 nm. The first width W1 of the gate line 130 is not limited to the numerical value. Widths of the first gate line 130a and the second gate line 130b in the first direction (the x direction) may be substantially the same. In other words, each of the first gate line 130a and the second gate line 130b may have the first width W1 in the first direction (the x direction).

The gate line 130 may include a conductive material where polycrystalline silicon or single crystalline silicon is doped with a metal material such as aluminum (Al), nickel (Ni), tungsten (W), titanium (Ti), or tantalum (Ta). Also, the gate line 130 may include metal. For example, the gate line 130 may include titanium nitride (TiN), tantalum nitride (TaN), titanium carbide (TiC), and tantalum carbide (TaC). The gate line 130 may include a single layer or a multilayer.

In the ESD device 100-1 according to an example embodiment, unlike a gate line of a general transistor, the gate line 130 may maintain a floating state without being connected to an electrode terminal. In other words, the gate line 130 may be a dummy gate line which does not perform an electrical function. The gate line 130 may perform a function of a mask in a doping process of forming the P-type and N-type impurity regions 110 and 120.

In FIGS. 3B to 3D, a gate insulation layer may be between the gate line 130 and the fin F. According to an example embodiment, the gate insulation layer may cover the whole top surface and side surface of the fin F except only a portion where a contact 140 is connected to the impurity regions 110 and 120. Also, according to embodiments, the gate insulation layer may be omitted based on that the gate line 130 does not perform an electrical function.

In the ESD device 100-1 according to an example embodiment, the fin-cut isolation region FC may have a second width W2 in the first direction (the x direction). The second width W2 may be, for example, 100 nm or less. Generally, a width of the fin-cut isolation region FC in the first direction (the x direction) may be defined as a distance between fins F adjacent to one another in the first direction (the x direction). However, as illustrated in FIG. 3B, when a portion of the second gate line 130b is included in the fin-cut isolation region FC, the width of the fin-cut isolation region FC in the first direction (the x direction) may be defined as a distance between second gate lines 130b adjacent to one another in the first direction (the x direction). In the ESD 100-1 according to an example embodiment, because the second width W2 of the fin-cut isolation region FC is 100 nm or less (for example, about 80 nm) and is very small, a separate gate line may not be disposed in the fin-cut isolation region FC.

For reference, in an ESD device of the related art, because the STI or DTI structure is formed by a depth which enables division of the active region ACT, a sufficient distance in the first direction (the x direction) has to be secured for forming a trench for STI or DTI. For example, a width of the STI or DTI structure of the ESD device of the related art in the first direction (the x direction) may be about 230 nm. Moreover, as a width of the STI or DTI structure in the first direction (the x direction) is wide, a separate gate line may be disposed on a top surface of the STI or DTI structure to extend. As a detailed example, when a width of the gate line 130 is about 70 nm, one additional gate line may be disposed at a center portion of a top surface of the STI or DTI structure having a width of about 230 nm in the first direction (the x direction) and may maintain an interval of about 80 nm with respect to gate lines adjacent thereto.

The contact 140 may be formed on the P-type impurity region 110 and the N-type impurity region 120. The P-type impurity region 110 may be electrically connected to the pad 200 through the contact 140, and the N-type impurity region 120 may be electrically connected to a terminal for applying the source voltage Vdd. When the gate insulation layer is on the top surface of the fin F, the contact 140 may be connected to the P-type impurity region 110 and the N-type impurity region 120 in a structure which passes through the gate insulation layer. Moreover, according to an embodiment, the N-type impurity region 120 may be electrically connected to, through the contact 140, a terminal for applying the ground voltage Vss.

The ESD device 100-1 according to an example embodiment may include the P-type impurity region 110 and the N-type impurity region 120 each formed in a fin (F) structure and may include the fin-cut isolation region FC for junction separation between the P-type impurity region 110 and the N-type impurity region 120, and thus, may have a small size, a low turn-on voltage, and a low on resistance. The small size, low turn-on voltage, and low on resistance of the ESD device 100-1 according to an example embodiment will be described in more detail with reference to FIG. 4.

Figure 4:
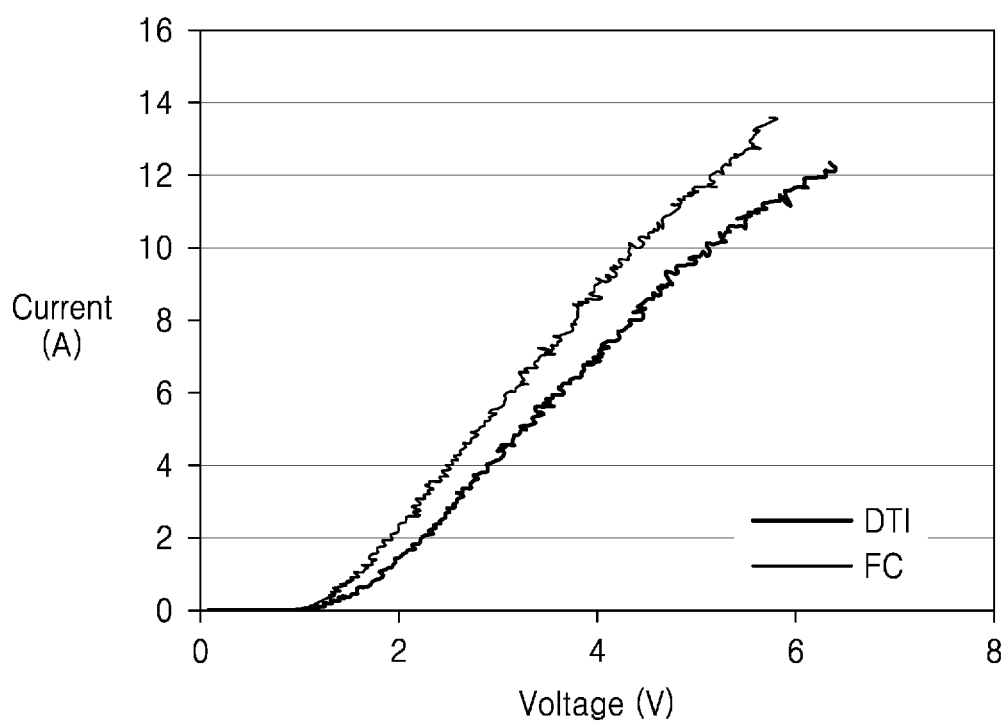
FIG. 4 is a graph showing a turn-on voltage characteristic and an on resistance characteristic of the ESD device having the P-type diode structure of FIGS. 3A to 3D and an ESD device having a P-type diode structure of the related art.

FIG. 4 is a graph showing a turn-on voltage characteristic and an on resistance characteristic of the ESD device having the P-type diode structure of FIGS. 3A to 3D and an ESD device having a P-type diode structure of the related art. The x axis represents a voltage applied to a region between a P-type impurity region 110 and an N-type impurity region 120, and the y axis represents a current based on the application of a voltage. A thick rectilinear line 'DTI' denotes an ESD device of the related art including a DTI structure, and a thin rectilinear line 'FC' denotes an ESD device according to an example embodiment, which includes a fin-cut isolation region FC. Here, the turn-on voltage may denote a voltage which allows a current to start to flow based on application of a voltage, and the on resistance may correspond to a resistance after turn-on, and for example, may correspond to a value obtained by dividing a voltage by a current after turn-on.

Referring to FIG. 4, the ESD device of the related art may have a turn-on voltage of about 1.56 V and may have an on resistance of about 0.33Ω. On the other hand, the ESD device 100-1 according to an example embodiment may have a turn-on voltage of about 1.25 V and may have an on resistance of about 0.3Ω. As a result, the ESD device 100-1 according to an example embodiment may have a lower turn-on voltage and a lower on resistance than those of the ESD device of the related art.

The ESD device of the related art used for an experiment may have an area of 450 μm$^2$ and may have an effective area of 6 μm$^2$. Here, the area and the effective area are as described above with reference to FIGS. 2D and 2D. On the other hand, the ESD device 100-1 according to an example embodiment may have an area of 406 μm$^2$ and may have an effective area of 6 μm$^2$. As a result, the ESD device 100-1 according to an example embodiment may have the same effective area as that of the ESD device of the related art and may have a lower turn-on voltage and a lower on resistance than those of the ESD device of the related art. Also, the ESD device 100-1 according to an example embodiment may be less in total area than the ESD device of the related art, and thus, may contribute to reduce a size of an ESD protection circuit (see 1000 of FIG. 1). As a result, the ESD device 100-1 according to an example embodiment may enable the implementation of an ESD protection circuit 1000 where a power performance area (PPA) is excellent.

Figure 5:
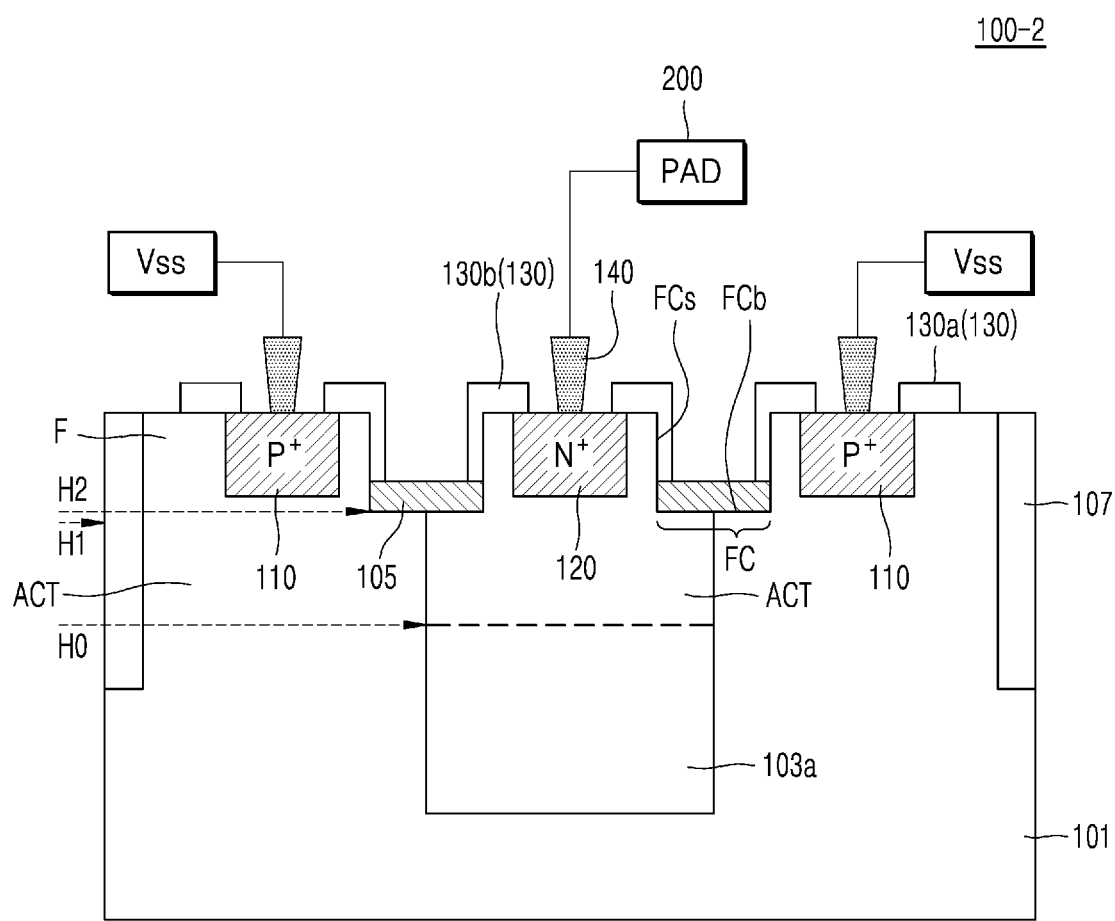
FIG. 5 is a cross-sectional view of an ESD device having an N-type diode structure in the ESD protection circuit of FIG. 1.

FIG. 5 is a cross-sectional view of an ESD device having an N-type diode structure in the ESD protection circuit 1000 of FIG. 1. Descriptions given above with reference to FIGS. 1 to 4 are omitted or will be briefly given below.

Referring to FIG. 5, an ESD device 100-2 according to an example embodiment may have an N-type diode structure, and thus, may differ from the ESD device 100-1 of FIGS. 3A to 3D. In detail, in the ESD device 100-2 according to an example embodiment, an N-type impurity region 120 may be formed at an upper portion of a fin F. Also, the N-type impurity region 120 may be disposed at a center portion of the fin F in a first direction (the x direction). Also, the P-type impurity region 110 may be disposed at the upper portion of the fin F. The P-type impurity region 110 may be disposed at an outer portion of the fin F in the first direction (the x direction). That is, the P-type impurity region 110 may be disposed at both outer portions of the N-type impurity region 120.

In the ESD device 100-2 according to an example embodiment, a well 103a may be an N-type well and may be formed under only the N-type impurity region 120. However, according to an embodiment, the well 103a may be omitted. The ESD device 100-2 according to an example embodiment may have an N-type diode structure, the N-type impurity region 120 may be electrically connected to a pad 200 through a contact 140 and the P-type impurity region 110 may be electrically connected to, through the contact 140, a terminal for applying a ground voltage Vss. The ESD device 100-2 according to an example embodiment may have a bar-type structure or a ring-type structure.

In addition, a fin-cut isolation region FC and a gate line 130 are the same as the descriptions of the ESD device 100-1 illustrated in FIGS. 3A to 3D.

Figure 6:
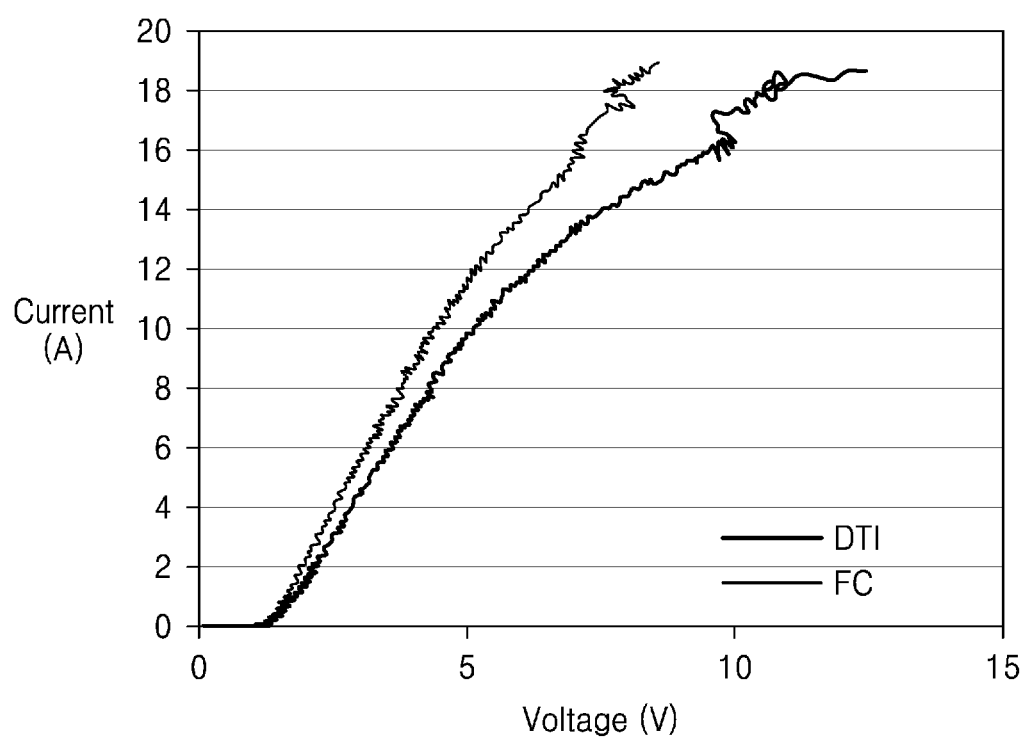
FIG. 6 is a graph showing a turn-on voltage characteristic and an on resistance characteristic of the ESD device having the N-type diode structure of FIG. 5 and an ESD device having an N-type diode structure of the related art.

FIG. 6 is a graph showing a turn-on voltage characteristic and an on resistance characteristic of the ESD device having the N-type diode structure of FIG. 5 and an ESD device having an N-type diode structure of the related art. Concepts of the x axis, the y axis, 'DTI', 'FC', a turn-on voltage, and an on resistance are as described above with reference to the graph of FIG. 4.

Referring to FIG. 6, the ESD device of the related art may have a turn-on voltage of about 1.44 V and may have an on resistance of about 0.35Ω. On the other hand, the ESD device 100-2 according to an example embodiment may have a turn-on voltage of about 1.25 V and may have an on resistance of about 0.31Ω. As a result, the ESD device 100-2 according to an example embodiment may have a lower turn-on voltage and a lower on resistance than those of the ESD device of the related art.

The ESD device of the related art used for an experiment may have an area of 433 μm$^2$ and may have an effective area of 92 μm$^2$. On the other hand, the ESD device 100-2 according to an example embodiment may have an area of 405 μm$^2$ and may have an effective area of 128 μm$^2$. As a result, the ESD device 100-2 according to an example embodiment may have an effective area which is greater than that of the ESD device of the related art and may have a lower turn-on voltage and a lower on resistance than those of the ESD device of the related art. Also, the ESD device 100-2 according to an example embodiment may be less in total area than the ESD device of the related art, and thus, may contribute to reduce a size of an ESD protection circuit (see 1000 of FIG. 1). As a result, the ESD device 100-2 according to an example embodiment may enable the implementation of an ESD protection circuit 1000 where a PPA is excellent.

For reference, as an effective area is widened, an on resistance may be easily reduced. Also, when a current path between the P-type impurity region 110 and the N-type impurity region 120 increases, a turn-on voltage may increase. Therefore, when an effective area is wide and a distance between the P-type impurity region 110 and the N-type impurity region 120 is short, an operation characteristic of an ESD device may be enhanced. When a current path is formed in a horizontal direction like a planar transistor, a turn-on voltage may decrease but leakage may increase.

In a related art ESD device, when an STI or DTI structure are included, a width of the STI or the DTI is large and a depth is deep, a current path between a P-type impurity region and an N-type impurity region may be long, and thus, a turn-on voltage may be relatively high. On the other hand, because the ESD device 100-1 or 100-2 according to an example embodiment includes the fin-cut isolation region FC where a width thereof is narrow and a depth is shallow, a current path between the P-type impurity region 110 and the N-type impurity region 120 may be short, and thus, a turn-on voltage may be relatively low. Also, as described above, the fin-cut isolation region FC may be formed by removing only a portion of the fin F, and thus, all or a portion of the active region ACT under the fin F may be maintained. Therefore, the ESD device 100-1 or 100-2 according to an example embodiment may have a structure where fins F adjacent to one another in the first direction (the x direction) are connected to one another through the active region ACT thereunder, and for example, may have a structure where the active region ACT is merged.

Figure 7:
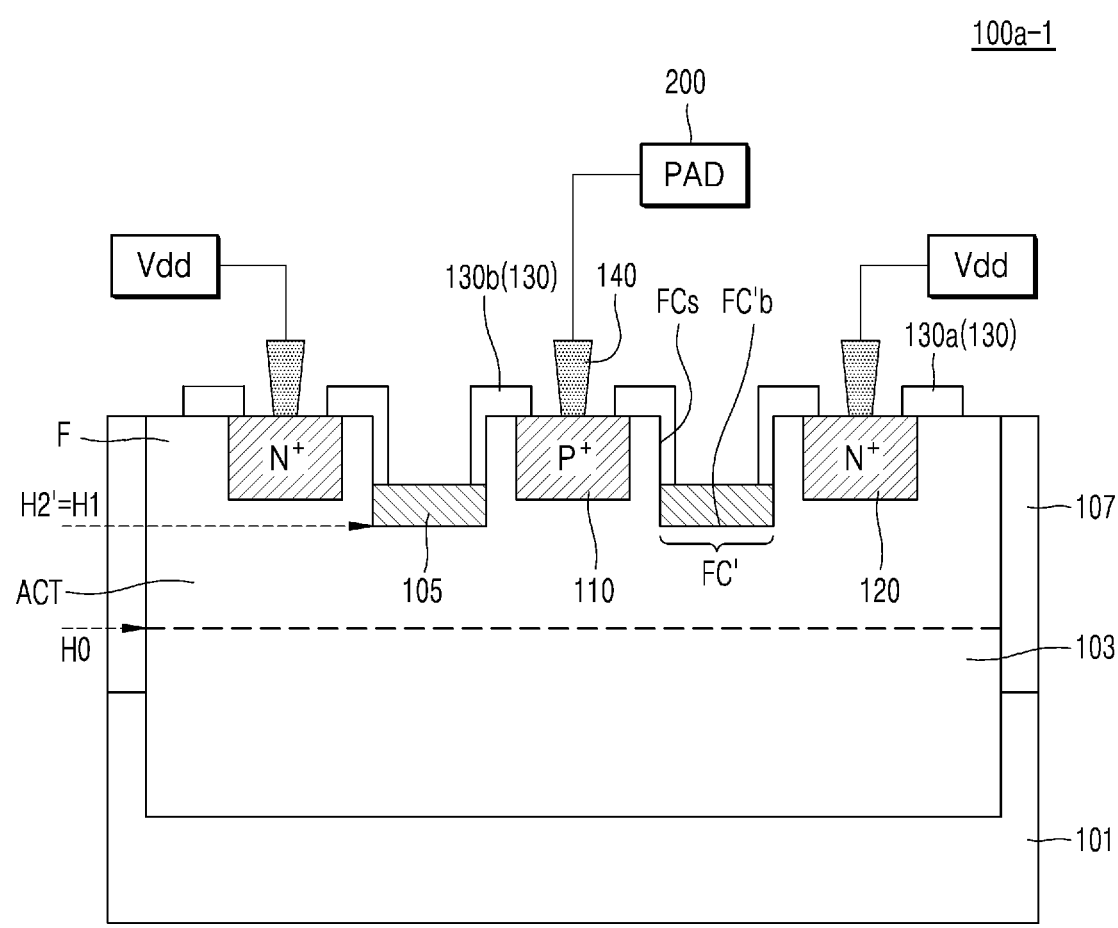
FIGS. 7 to 9 are cross-sectional views of ESD devices having a P-type diode structure according to example embodiments.
Figure 8:
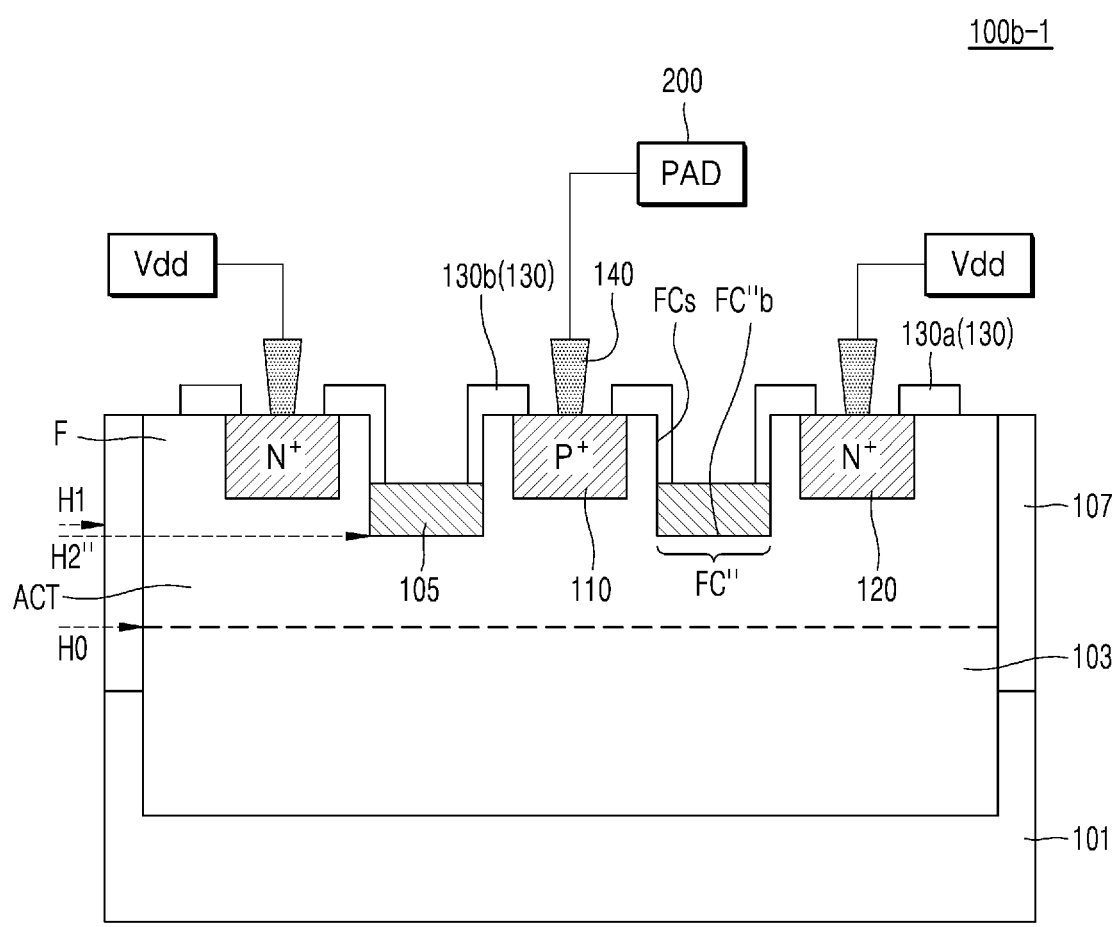
Figure 9:
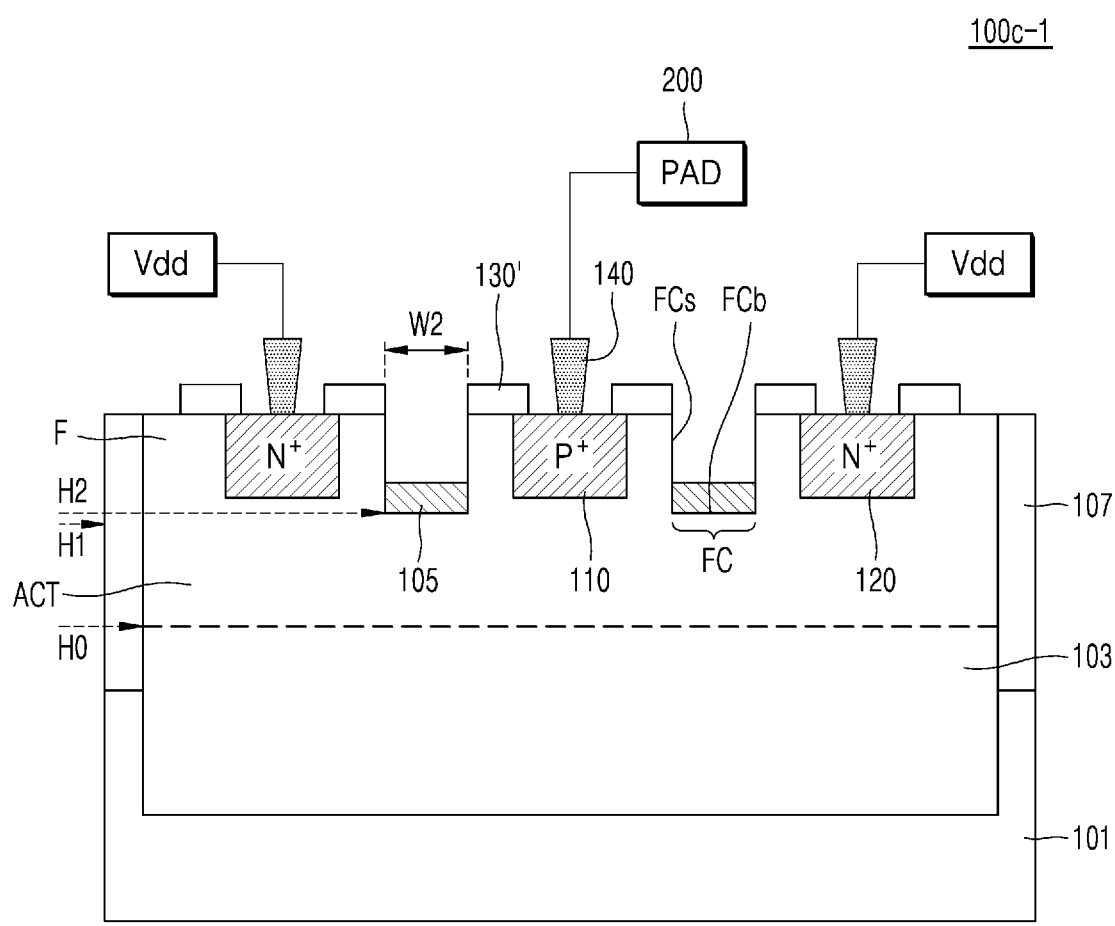

FIGS. 7 to 9 are cross-sectional views of ESD devices having a P-type diode structure, according to example embodiments and may each correspond to FIG. 3B. Descriptions given above with reference to FIGS. 1 to 6 are omitted or will be briefly given below.

Referring to FIG. 7, in terms of a depth of a fin-cut isolation region FC', an ESD device 100a-1 according to an example embodiment may differ from the ESD device 100-1 of FIGS. 3A to 3D. In detail, in the ESD device 100a-1 according to an example embodiment, a second height H2' which is a height of a bottom surface FC'b of the fin-cut isolation region FC' may be substantially the same as a first height H1, which is a height of a top surface (see Sf of FIG. 3C) of a substrate 101. In other words, in the ESD device 100a-1 according to an example embodiment, the fin-cut isolation region FC' may be formed by removing a fin F protruding from the top surface Sf of the substrate 101 in a third direction (the z direction).

Referring to FIG. 8, in terms of a depth of a fin-cut isolation region FC", an ESD device 100b-1 according to an example embodiment may differ from the ESD device 100-1 of FIGS. 3A to 3D. In detail, in the ESD device 100b-1 according to an example embodiment, a second height H2", which is a height of a bottom surface FC"b of the fin-cut isolation region FC", may be lower than a first height H1, which is a height of a top surface Sf of a substrate 101. In other words, in the ESD device 100b-1 according to an example embodiment, the fin-cut isolation region FC" may be formed by removing a fin F, protruding from the top surface Sf of the substrate 101 in a third direction (the z direction), and a portion of an upper portion of an active region ACT under the fin F.

Referring to FIG. 9, in terms of a structure of a gate line 130', an ESD device 100c-1 according to an example embodiment may differ from the ESD device 100-1 of FIGS. 3A to 3D. In detail, in the ESD device 100c-1 according to an example embodiment, the gate line 130' may be disposed only on the upper surface of the fin F in a first direction (the x direction) and may not be disposed on a fin-cut isolation region FC. In other words, in the ESD device 100c-1 according to an example embodiment, a second gate line 130b structure covering the fin F and the fin-cut isolation region FC in a first direction (the x direction) may not be formed unlike the ESD device 100-1 of FIGS. 3A to 3D. Therefore, as illustrated in FIG. 9, a second width W2, which is a width of the fin-cut isolation region FC in the first direction (the x direction), may be defined as a distance between side surfaces of fins F adjacent to each other in the first direction (the x direction), and for example, may be defined as a distance between both side surfaces FCs of the fin-cut isolation region FC.

According to an embodiment, in the ESD devices 100a-1, 100b-1, and 100c-1 of FIGS. 7 to 9, the N-type impurity region 120 may be electrically connected to, through a contact 140, a terminal for applying a ground voltage Vss.

Figure 10A:
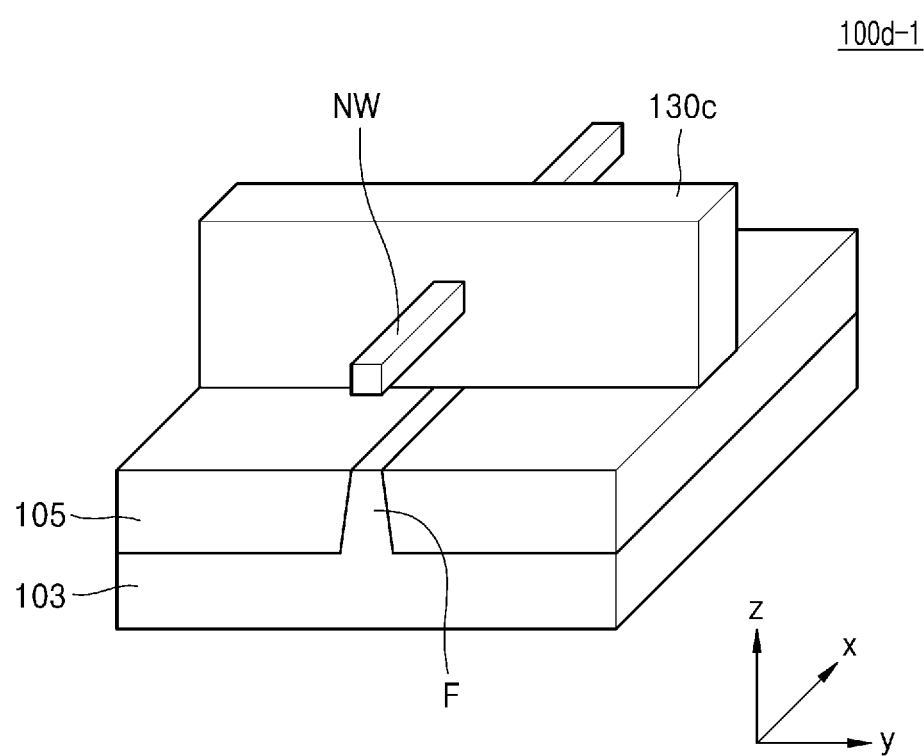
FIGS. 10A to 10C are a perspective view and cross-sectional views of an ESD device having a P-type diode structure according to an example embodiment.
Figure 10B:
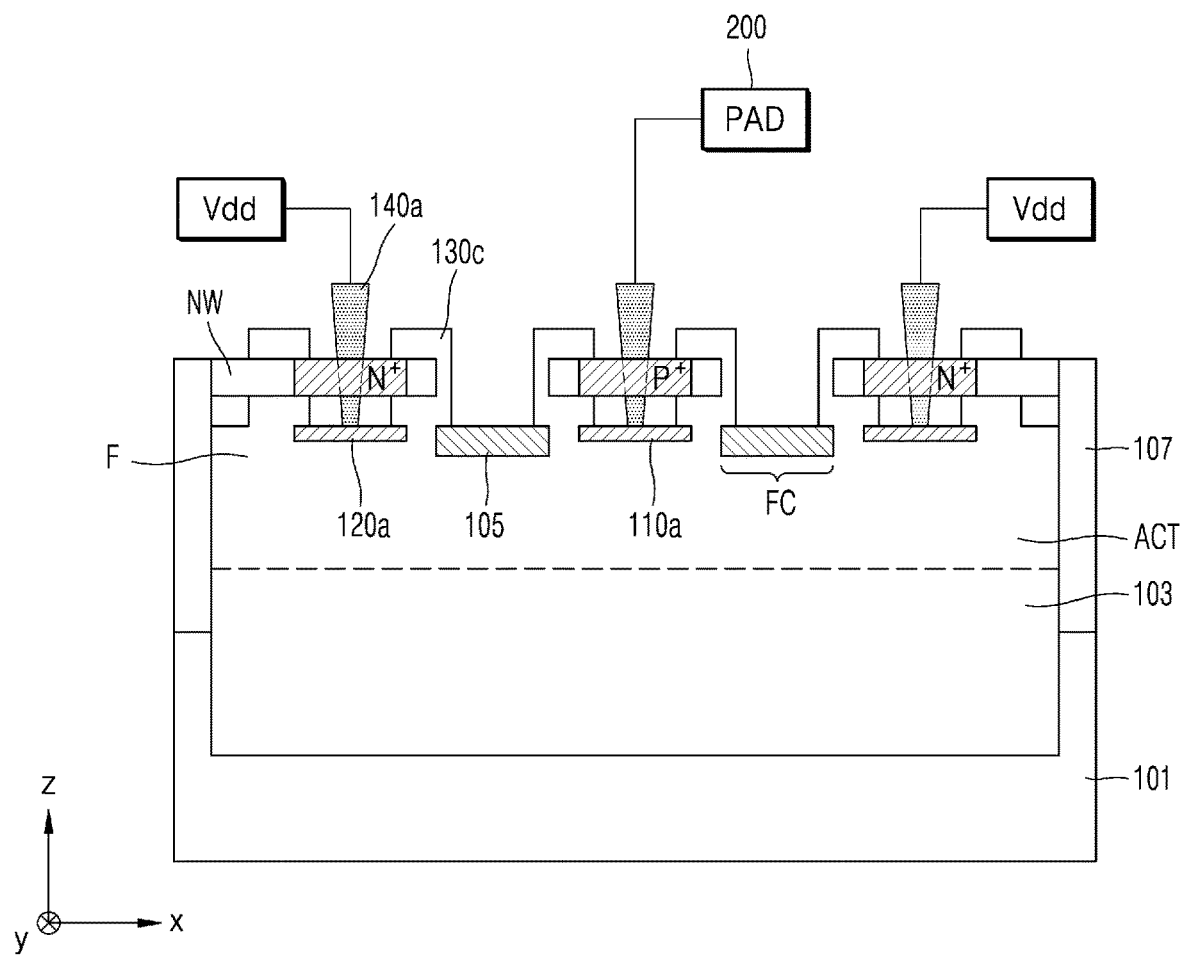
Figure 10C:
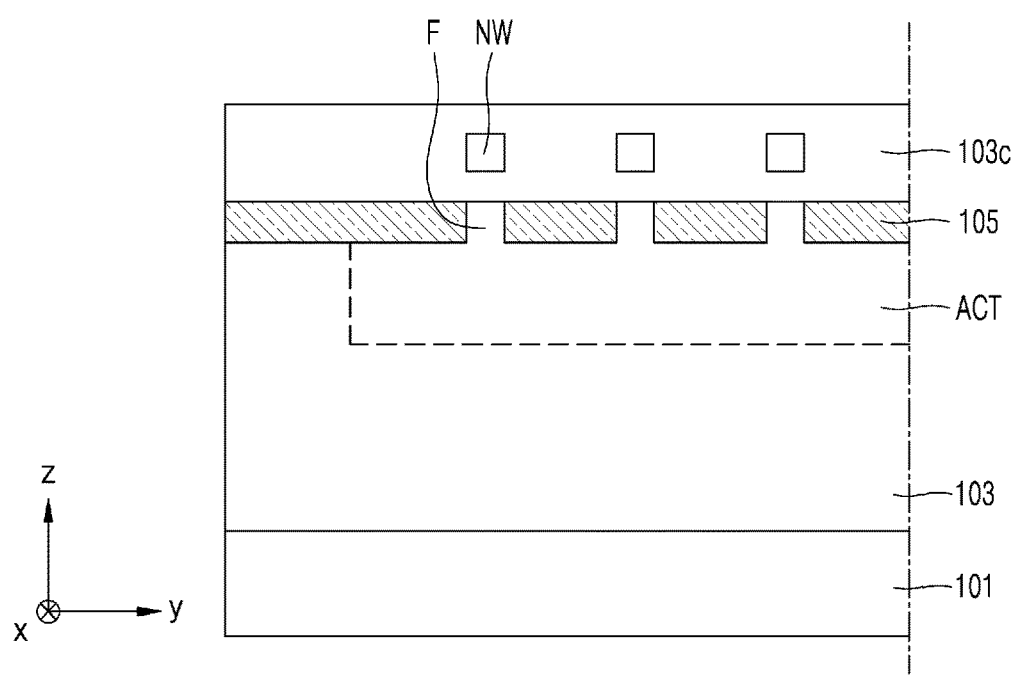

FIGS. 10A to 10C are a perspective view and cross-sectional views of an ESD device having a P-type diode structure, according to an embodiment and may correspond to FIGS. 3B and 3C. Descriptions given above with reference to FIGS. 1 to 9 are omitted or will be briefly given below.

Referring to FIGS. 10A to 10C, an ESD device 100d-1 according to an example embodiment may include a gate all around (GAA) structure, and thus, may differ from the ESD device 100-1 of FIGS. 3A to 3D. To provide a more detailed description, as illustrated in FIG. 10A, the ESD device 100d-1 according to an example embodiment may have a GAA structure where the gate line 130c completely surrounds four surfaces of a nano wire NW. For reference, FIG. 10A is a perspective view for conceptually showing a three-dimensional (3D) shape of the ESD device 100d-1 according to an example embodiment. FIGS. 10B and 10C correspond to the cross-sectional views of the ESD device 100d-1 according to an example embodiment, where six gate lines 130c apart from one another in the first direction (the x direction) may be disposed and three nano wires NW, which are apart from one another in a second direction (the y direction) and are surrounded by a gate line 130c, may be disposed.

A fin F may be formed to have a certain height a third direction (the z direction), and then, an intermediate portion of the fin F may be removed, thereby forming the nano wire NW. In other words, the nano wire NW may correspond to an upper end portion of an initial fin F. According to an example embodiment, two or more intermediate portions of the fin F in the third direction (the z direction) may be removed, and thus, two or more nano wires NW apart from one another in the third direction (the z direction) may be formed.

In the ESD device 100d-1 according to an example embodiment, a portion of an upper portion of the fin F and the nano wire NW may be cut by a fin-cut isolation region FC, and thus, a P-type impurity region 110a and an N-type impurity region 120a may be apart from each other in the first direction (the x direction). As illustrated in FIG. 10B, the P-type impurity region 110a or the N-type impurity region 120a may be formed by doping a portion of an upper portion of the fin F and a portion of the nano wire NW with P-type impurities or N-type impurities. The contact 140a may be formed in a structure where the contact 140a contacts an impurity region of the nano wire NW and the fin F together.

As a result, the ESD device 100d-1 according to an example embodiment may be substantially the same as the ESD device 100-1 of FIGS. 3A to 3D, except for the nano wire NW being disposed apart from the upper portion of the fin F. In other words, as seen in FIGS. 10B and 10C, when the nano wire NW is connected to the fin F in the third direction (the z direction), it may be seen that the ESD device 100d-1 according to an example embodiment has substantially the same structure as a structure illustrated in FIGS. 3B and 3C. For reference, a space between the fin F and the nano wire NW may be filled along with a process of filling an upper of an isolation insulation layer 105 of the fin-cut isolation region FC.

Figure 11:
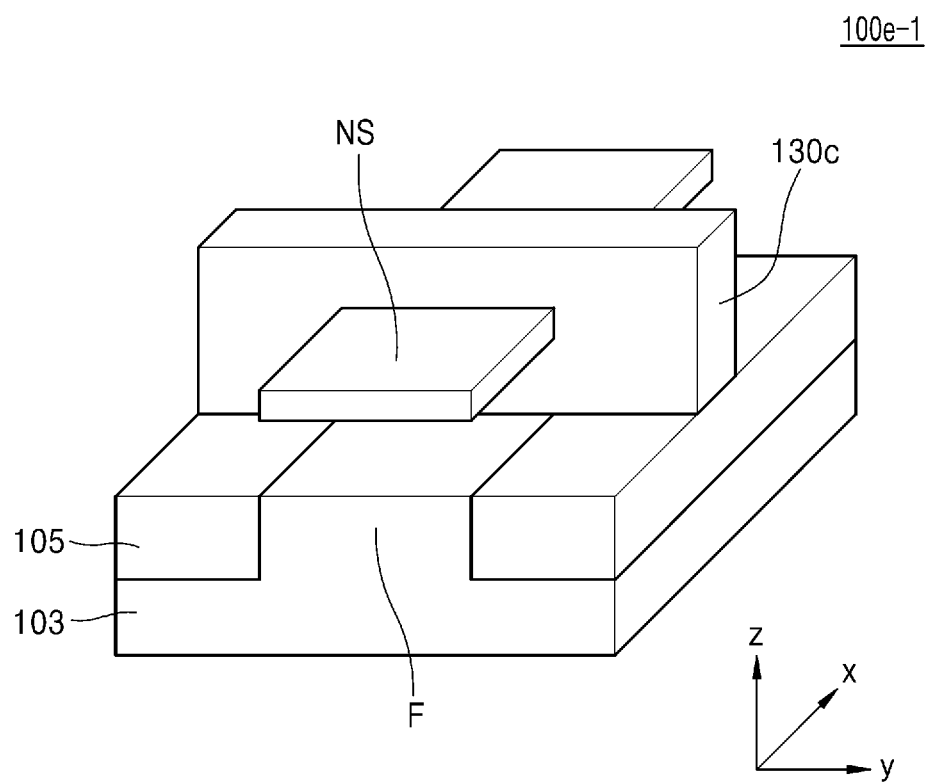
FIG. 11 is a perspective view of an ESD device having a P-type diode structure according to an example embodiment.

FIG. 11 is a perspective view of an ESD device having a P-type diode structure, according to an example embodiment and conceptually shows a 3D shape of an ESD device 100e-1 according to an example embodiment as in FIG. 10A. Descriptions given above with reference to FIGS. 10A to 10C are omitted or will be briefly given below.

Referring to FIG. 11, an ESD device 100e-1 according to an example embodiment may include a multi-bridge channel (MBC) structure, and thus, may differ from the ESD device 100d-1 of FIGS. 10A to 10C. To provide a more detailed description, as illustrated in FIG. 11, the ESD device 100e-1 according to an example embodiment may have an MBC structure where the gate line 130c completely surrounds four surfaces of a nano sheet NS. The nano sheet NS may have a structure of a sheet. According to an example embodiment, a width of the nano sheet NS in a second direction (the y direction) may be several times (or tens of times) times greater than a thickness of the nano sheet NS in a third direction (the z direction), and thus, may structurally differ from a nano wire. As a width of the nano sheet NS in the second direction (the y direction) increases, a width of a fin F thereunder in the second direction (the y direction) may increase corresponding to the nano sheet NS. In addition, the number of gate lines 130c and nano sheets NS, a method of forming the nano sheet NS, a structure of each of a P-type impurity region and an N-type impurity region, and a structure of a contact are as described above with reference to FIGS. 10A to 10C illustrating the ESD device 100d-1.

FIGS. 12A-12B, 13A-13C, 14A-14C, 15A-15B and 16 are cross-sectional views illustrating a process of manufacturing an ESD device having a P-type diode structure of FIGS. 3A to 3D, according to an example embodiment. Each of FIG. 12A, FIG. 13A, FIG. 14A, FIG. 15A, and FIG. 16 may correspond to FIG. 3B, each of FIG. 12B, FIG. 13B, FIG. 14B, and FIG. 15B may correspond to FIG. 3C, and each of FIG. 13C and FIG. 14C may correspond to FIG. 3D. The process of manufacturing an ESD device will be described below with reference to 12A-12B, 13A-13C, 14A-14C, 15A-15B and 16 in conjunction with FIGS. 3A to 3D, and descriptions given above with reference to FIGS. 1 to 11 are omitted or will be briefly given below.

Figure 12A:
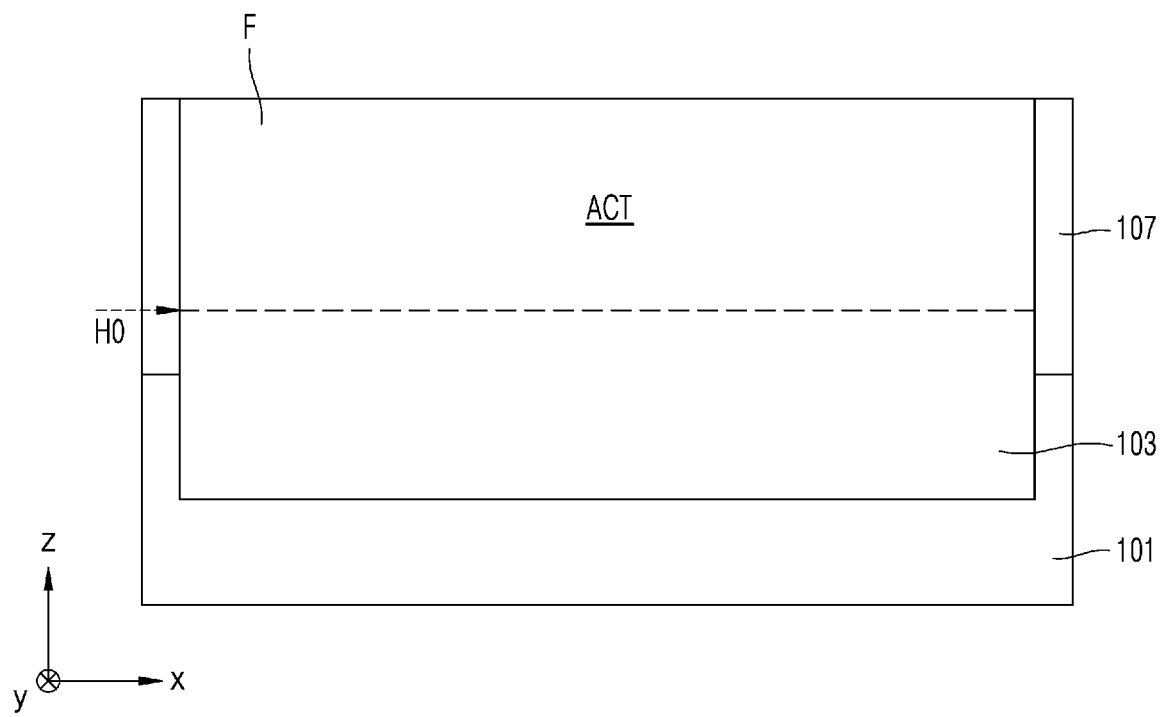
FIGS. 12A and 12B are cross-sectional views illustrating a process of manufacturing an ESD device having a P-type diode structure of FIGS. 3A to 3D according to an example embodiment.
Figure 12B:
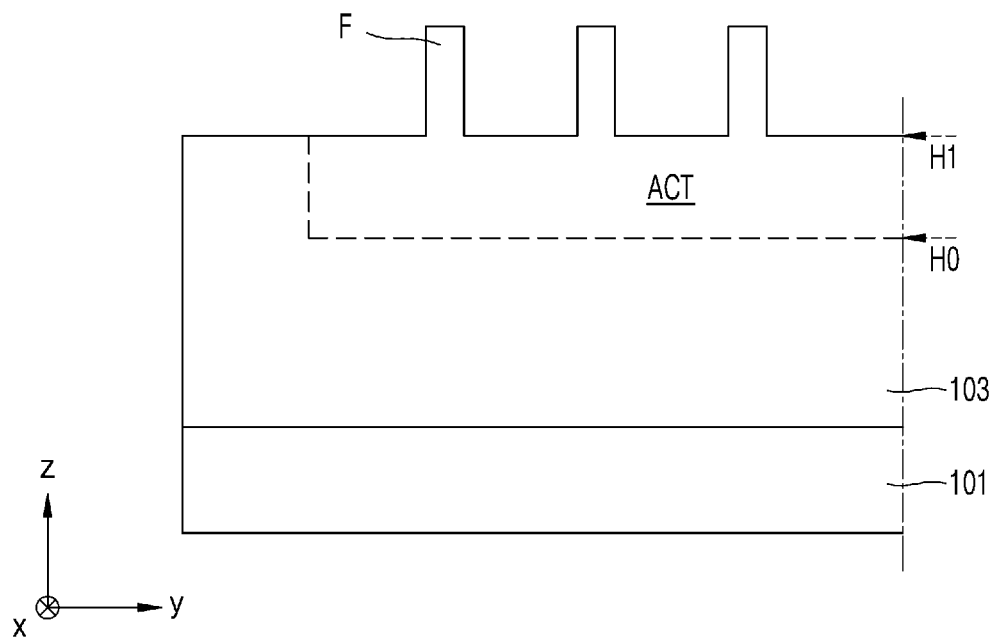

Referring to FIGS. 12A and 12B, a well 103 may be formed on a substrate 101. The well 103 may be an N-type well and may be formed by doping N-type impurities on the substrate 101 by a certain depth. As illustrated by a dashed line, an active region ACT may be defined at an upper portion of the well 103. For instance, the active region ACT may be above the region indicated by H0. The active region ACT may be higher in doping concentration than the other portion of the well 103. For example, as described above, when the well 103 is an N− region where N-type impurities are doped at a doping concentration of $10^{16}/cm^3$ or less, the active region ACT may be an N0 region where N-type impurities are doped at a doping concentration of $10^{16}/cm^3$ or more. However, a doping concentration of each of the well 103 and the active region ACT is not limited to the numerical value.

After the well 103 is formed, an isolation structure 107 defining an ESD device may be formed on the substrate 101. The isolation structure 107 may include an insulation layer such as oxide, nitride, or oxynitride.

Subsequently, a mask pattern extending in a first direction (the x direction) may be formed on a top surface of the substrate 101. The mask pattern may include, for example, a lower mask pattern and an upper mask pattern. Also, the lower mask pattern may be formed of a hard mask layer such as oxide or nitride, and the upper mask pattern may include photoresist. According to an example embodiment, each of the lower mask pattern and the upper mask pattern may be formed of a hard mask layer. After the mask pattern is formed, an upper portion of the substrate 101 may be etched by using the mask pattern as a mask, thereby forming a plurality of fins F, which extend in the first direction (the x direction) and are apart from one another in a second direction (the y direction). After the fins F are formed, a top surface Sf of the substrate 101 may have a first height H1. According to an example embodiment, the lower mask pattern may remain on a top surface of each of fins F. For reference, a cross-sectional surface corresponding to FIG. 3D may be substantially the same as FIG. 12B, and thus, a cross-sectional view thereof is omitted.

Figure 13A:
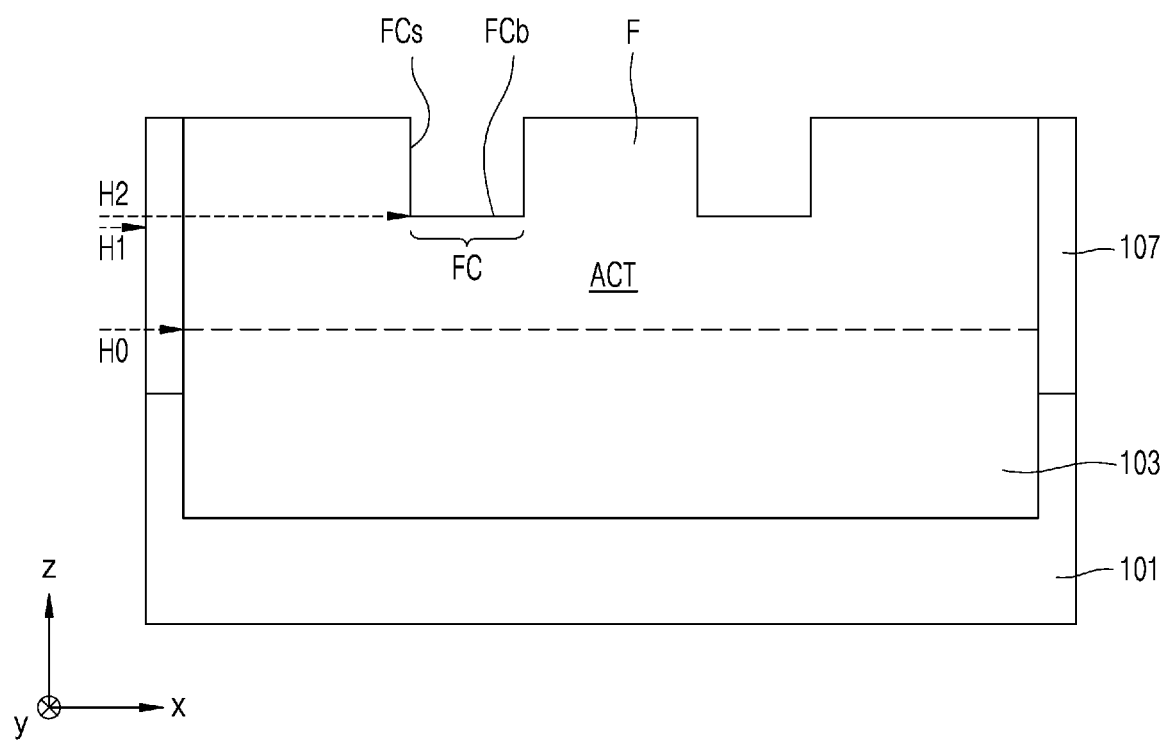
FIGS. 13A to 13C are cross-sectional views illustrating a process of manufacturing an ESD device having a P-type diode structure of FIGS. 3A to 3D according to an example embodiment.
Figure 13B:
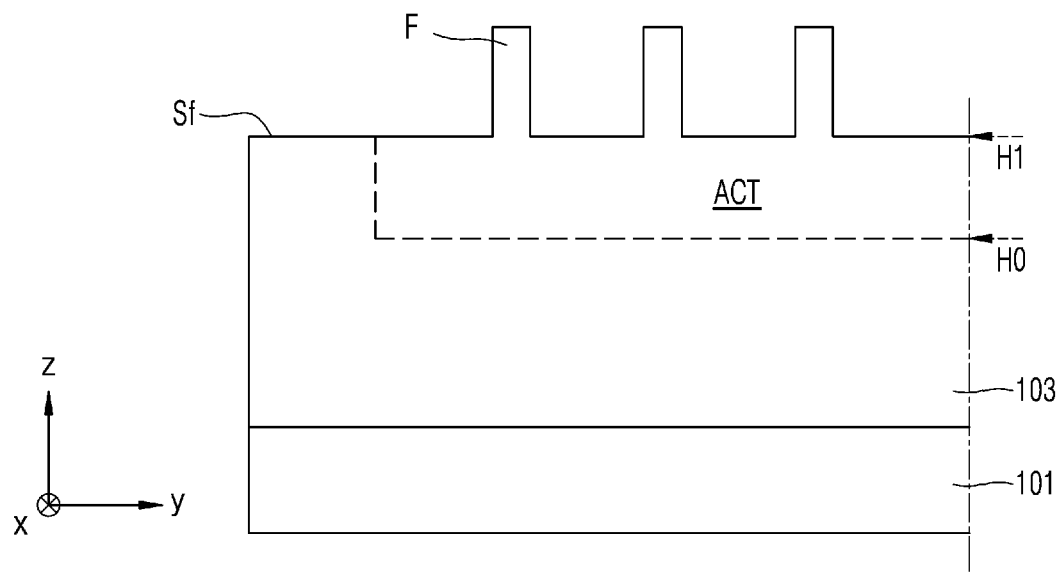
Figure 13C:
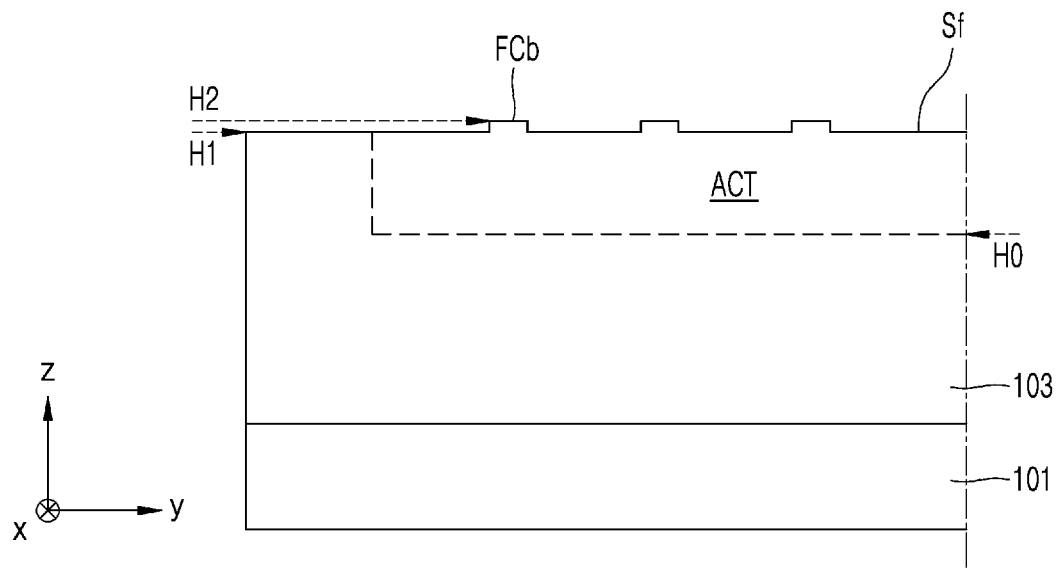

Referring to FIGS. 13A to 13C, after the fins F are formed, a fin-cut isolation region FC for dividing each of the fins F into a plurality of portions (for example, three portions) may be formed in the first direction (the x direction). The fin-cut isolation region FC may extend in a second direction (the y direction). Therefore, as shown in FIG. 13C, the fins F may be removed in the second direction (the y direction). The fin-cut isolation region FC, as described above, may have a second width W2 in the first direction (the x direction), and the second width W2 may be small, and for example, may be 100 nm or less. A bottom surface FCb of the fin-cut isolation region FC may have a second height H2 and may be slightly higher than the first height H1, which is a height of the top surface Sf of the substrate 101. However, according to an embodiment, the bottom surface FCb of the fin-cut isolation region FC may be substantially the same as the height of the top surface Sf of the substrate 101, or may be lower than the height of the top surface Sf of the substrate 101.

Figure 14A:
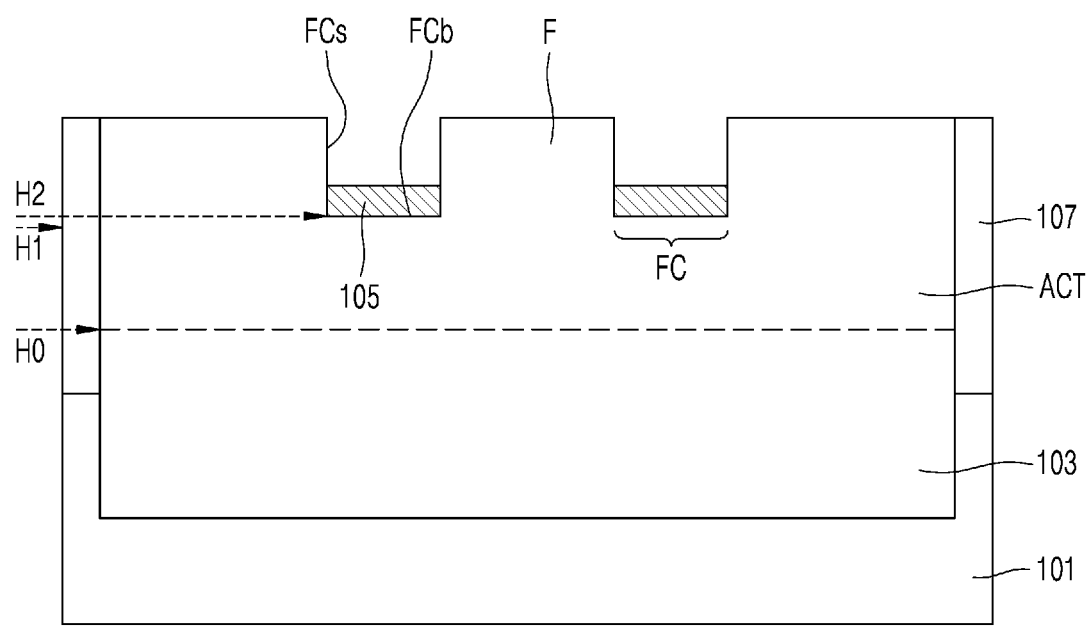
FIGS. 14A to 14C are cross-sectional views illustrating a process of manufacturing an ESD device having a P-type diode structure of FIGS. 3A to 3D according to an example embodiment.
Figure 14B:
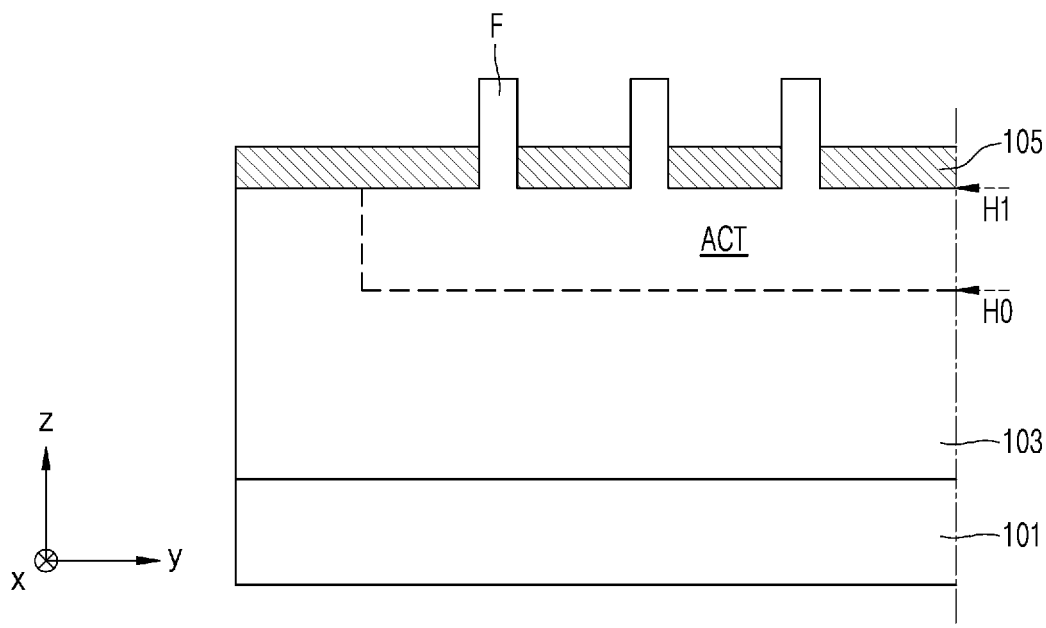
Figure 14C:
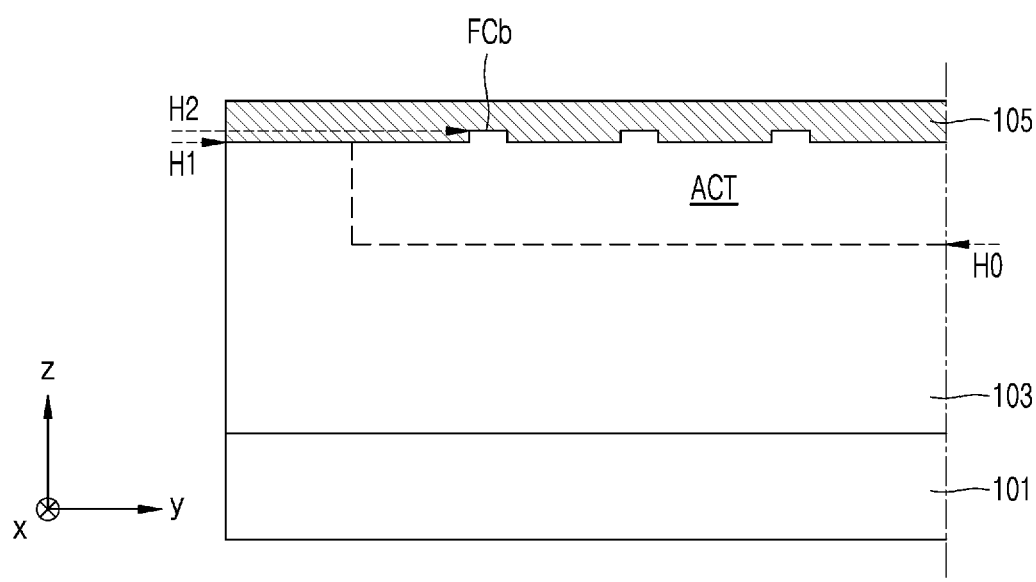

Referring to FIGS. 14A to 14C, an insulating material for an isolation insulation layer 105 may be deposited on an entire surface of the substrate 101 and may be planarized. The planarization may be performed through a chemical mechanical polishing (CMP) process and/or an etching process such as etch-back. The lower mask pattern remaining on a top surface of each of the fins F may act as etch stop layer in a planarization process. By performing the planarization process, the insulating material for the isolation insulation layer may be filled into a region between fins F adjacent to each other in the second direction (the y direction) and into the fin-cut isolation region FC in the first direction (the x direction), and a top surface of the insulating material for the isolation insulation layer may be substantially coplanar with a top surface of the lower mask pattern.

Subsequently, by removing the insulating material for the isolation insulation layer 105 by a certain depth by using the lower mask pattern as a mask, the isolation insulation layer 105 may be formed. The isolation insulation layer 105 may be formed to have an appropriate thickness on the basis of a separation function between fins F in the second direction (the y direction) and junction separation function between a P-type impurity region 110 and an N-type impurity region 120 in the first direction (the x direction). The isolation insulation layer 105 may be formed, and then, the lower mask pattern may be removed.

In association with forming the isolation insulation layer 105, when the insulating material for the isolation insulation layer is high in etch selectivity with respect to the lower mask pattern, according to embodiments, the planarization process may be omitted, and the isolation insulation layer 105 may be immediately formed through an etch-back process. Also, when the insulating material for the isolation insulation layer is high in etch selectivity with respect to the fins F, according to embodiments, the isolation insulation layer 105 may be formed through the etch-back process without the lower mask pattern.

Figure 15A:
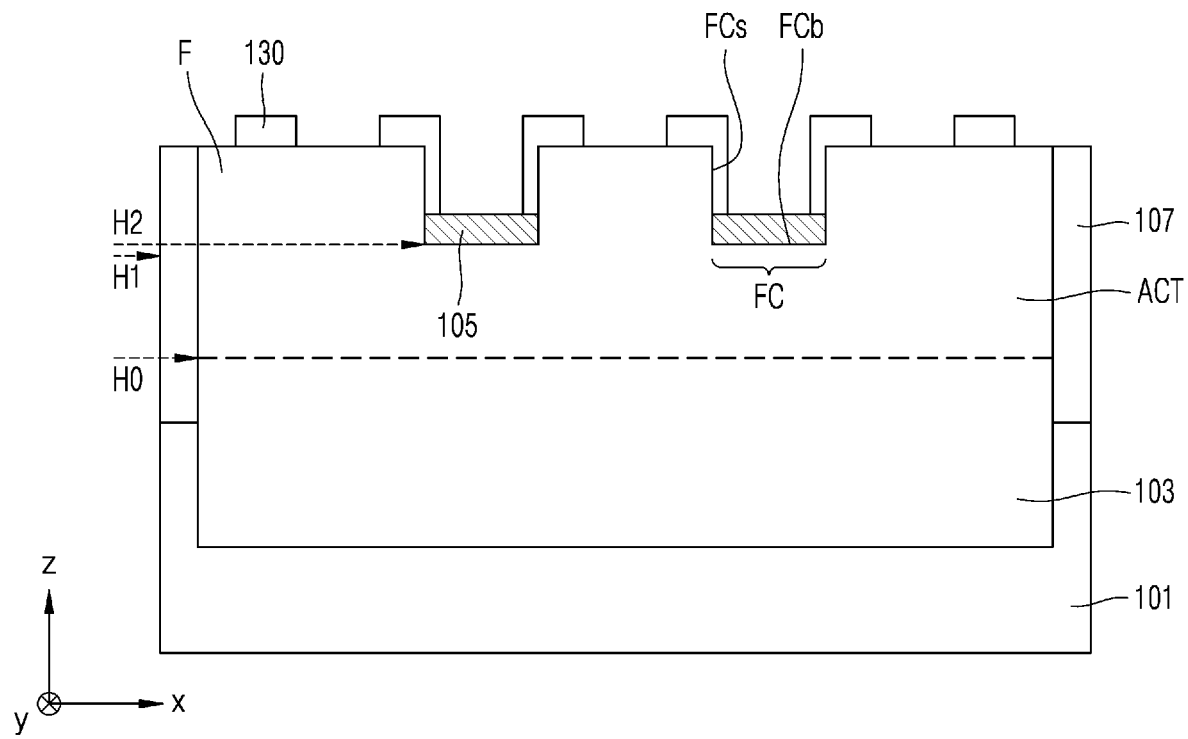
FIGS. 15A and 15B are cross-sectional views illustrating a process of manufacturing an ESD device having a P-type diode structure of FIGS. 3A to 3D according to an example embodiment.
Figure 15B:
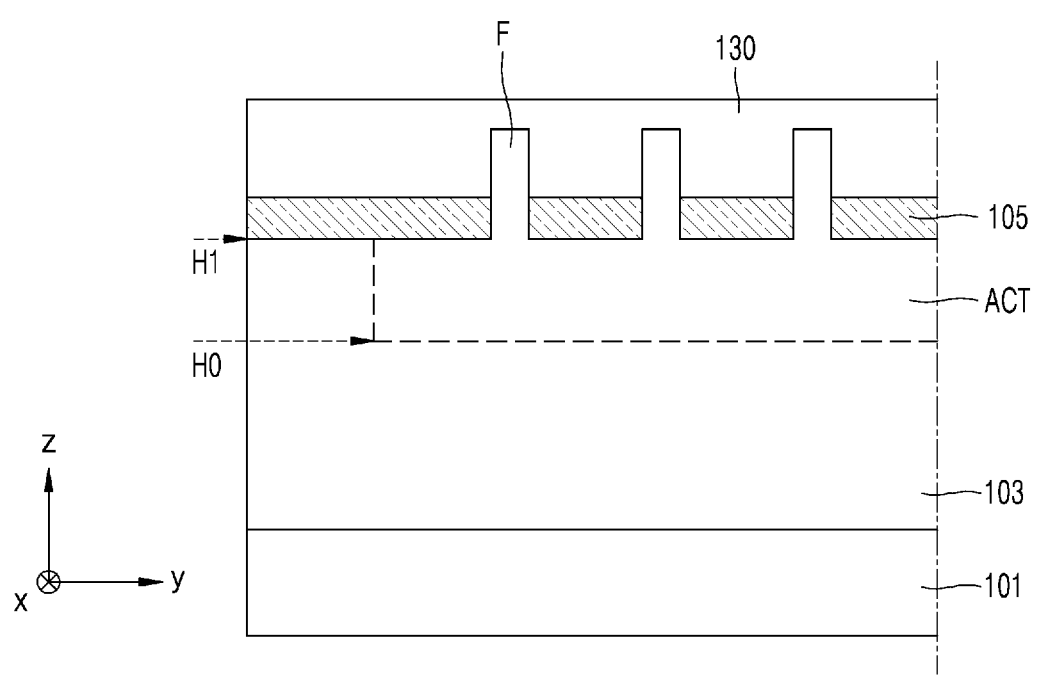

Referring to FIGS. 15A and 15B, after the isolation insulation layer 105 is formed, a dielectric layer covering an entire surface of a resultant material on the substrate 101 may be formed to have a certain thickness. For example, the dielectric layer may cover a top surface of the isolation insulation layer 105 and both side surfaces and a top surface of each of the fins F. According to an example embodiment, the dielectric layer may configure a gate insulation layer of a gate line 130 later. The gate line 130 may not perform a substantially electrical function, and thus, according to example embodiments, the dielectric layer may be omitted.

After the dielectric layer is formed, a conductive layer covering the entire surface of the resultant material of the substrate 101 may be formed and planarized. A material of the conductive layer may be same as the material described for the gate line 130 in the ESD device 100-1 of FIGS. 3A to 3D. Subsequently, a mask pattern may be formed on a top surface of a planarized conductive layer. The mask pattern may have a structure including mask patterns which extend in the second direction (the y direction) and are apart from each other in the first direction (the x direction). The mask pattern may include a first mask pattern, which is disposed on a conductive layer corresponding to only the fin F in the first direction (the x direction), and a second mask pattern which is disposed on a conductive layer corresponding to the fin F and the fin-cut isolation region FC.

Subsequently, the gate line 130 may be formed by etching a conductive layer by using the mask pattern as a mask. The gate line 130 may have a structure including gate lines which extend in the second direction (the y direction) to correspond to the mask pattern and are apart from each other in the first direction (the x direction) and may cover a top surface and both side surfaces of each of the fin F. Also, as described above, the gate line 130 may include a first gate line 130*a* and a second gate line 130*b*. The first gate line 130*a* may be disposed on only an upper surface of the fin F in the first direction (the x direction) to correspond to the first mask pattern. The second gate line 130*b* may be disposed on an upper surface of the fin F and the fin-cut isolation region FC to correspond to the second mask pattern.

When the gate line 130 is formed, the dielectric layer on the fin F and the isolation insulation layer 105 may be removed, and a top surface of the isolation insulation layer 105 and a top surface of the fin F between adjacent gate lines 130 may be exposed in the first direction (the x direction). According to an embodiment, when the gate line 130 is formed, the dielectric layer on the fin F and the isolation insulation layer 105 may be maintained without being removed. In this case, after the gate line 130 is formed, the dielectric layer may be maintained on the top surface of the isolation insulation layer 105 and the top surface of the fin F between adjacent gate lines 130. For reference, after the gate line 130 is formed, a cross-sectional surface corresponding to FIG. 3D may be substantially the same as FIG. 14C. Therefore, a cross-sectional view thereof is omitted.

Figure 16:
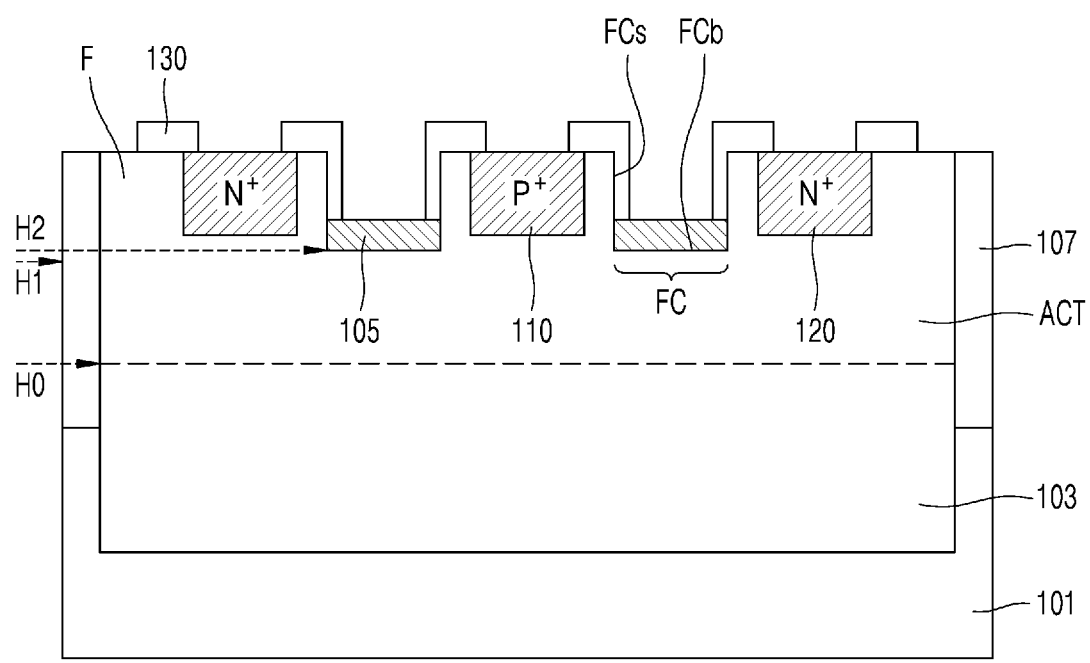
FIG. 16 is a cross-sectional view illustrating a process of manufacturing an ESD device having a P-type diode structure of FIGS. 3A to 3D according to an example embodiment.

Referring to FIG. 16, after the gate line 130 is formed, a P-type impurity region 110 and an N-type impurity region 120 may be formed. In more detail, first, except for the fin F portion where the P-type impurity region 110 is to be formed, a first mask pattern covering the other fin F portion may be formed. Subsequently, an ion implantation process of implanting P-type impurities into an exposed fin F portion may be performed by using the first mask pattern as a mask, thereby forming the P-type impurity region 110. Subsequently, the first mask pattern may be removed, the second mask pattern covering only the P-type impurity region 110 may be formed, and an ion implantation process of implanting N-type impurities into an exposed fin F portion may be performed by using the second mask pattern as a mask, thereby forming the N-type impurity region 120.

In the ion implantation process, the gate line 130 may act as a mask along with the first mask pattern or the second mask pattern. Therefore, as illustrated in FIG. 16, a fin F portion under the gate line 130 may not be doped. However, a portion of a lower portion of the gate line 130 may be doped with corresponding impurities through diffusion. Therefore, the P-type impurity region 110 and the N-type impurity region 120 may be formed up to a portion slightly inward from a side surface of the gate line 130 in the first direction (the x direction).

After the P-type impurity region 110 and the N-type impurity region 120 are formed, a contact 140 connected to each of the P-type impurity region 110 and the N-type impurity region 120 may be formed, and thus, the ESD device 100-1 of FIGS. 3A to 3D may be finished. An insulating material layer covering all of a result material on the substrate 101 may be formed, an interlayer insulation layer may be formed by planarizing the insulating material layer, a mask pattern may be formed on the interlayer insulation layer, a contact hole may be formed through an etching process using a mask pattern, and the contact 140 may be formed by filling a conductive material into the contact hole.

While the inventive concept has been particularly shown and described with reference to example embodiments thereof, it will be understood that various changes in form and details may be made therein without departing from the spirit and scope of the following claims.

What is claimed is:

1. An electrostatic discharge (ESD) device comprising:
   a well formed in a substrate, the well having a first conductive type and a first doping concentration;
   an active region formed at an upper portion of the substrate, the active region having a second doping concentration higher than the first doping concentration;
   a plurality of fins extending in a first direction across the well in a protruding manner from the substrate, the plurality of fins being spaced apart from one another in a second direction perpendicular to the first direction;
   a first conductive impurity region formed by doping a portion of each of the plurality of fins with first conductive impurities;
   a second conductive impurity region formed by doping a portion of each of the plurality of fins with second conductive impurities having a second conductive type different from the first conductive type, the second conductive impurity region being disposed apart from the first conductive impurity region in the first direction; and
   a fin-cut isolation region disposed between the first conductive impurity region and the second conductive impurity region in the first direction in each of the plurality of fins to cut each of the plurality of fins into at least a first fin portion and a second fin portion,
   wherein a bottom surface of the fin-cut isolation region is higher than a bottom surface of the active region.

2. The ESD device of claim 1, wherein the bottom surface of the fin-cut isolation region is higher than a top surface of the substrate.

3. The ESD device of claim 1, wherein a first portion of the active region under the first fin portion and a second portion of the active region under the second fin portion are connected to each other through a third portion of the active region under the fin-cut isolation region.

4. The ESD device of claim 1, further comprising a plurality of gate lines disposed apart from one another in the first direction to cover a portion of each of the plurality of fins and extend in the second direction,
   wherein each of the first conductive impurity region and the second conductive impurity region is disposed between two gate lines adjacent to each other in the first direction.

5. The ESD device of claim 4, wherein a lower portion of the fin-cut isolation region is filled with an isolation insulation layer,
   a first portion of a first gate line, among the plurality of gate lines, and a first portion of a second gate line, among the plurality of gate lines, are disposed in the fin-cut isolation region, the first portion of the first gate line and the first portion of the second gate line cover a side surface of a corresponding fin and a top surface of the isolation insulation layer, and in the fin-cut isolation region, the first portion of the first gate line and the first portion of the second gate line are separated from each other without a third gate line between the first gate line and the second gate line.

6. The ESD device of claim 5, wherein, in the fin-cut isolation region, a distance between the first gate line and the second gate line in the first direction is 100 nm or less.

7. The ESD device of claim 1, further comprising a contact contacting each of the first conductive impurity region and the second conductive impurity region, wherein the contact is configured to apply one of a source voltage, a signal voltage, or a ground voltage.

8. The ESD device of claim 1, wherein, the first conductive type is an N type, and the second conductive type is a P type, and the ESD device has a P-type diode structure where the second conductive impurity region is disposed at a center of each of the plurality of fins, and the first conductive impurity region is disposed at both sides of the second conductive impurity region in the first direction, or the ESD device has an N-type diode structure where the first conductive impurity region is disposed at the center of each of the plurality of fins, and the second conductive impurity region is disposed at both the sides of the first conductive impurity region in the first direction.

9. The ESD device of claim 8, wherein the ESD device has a bar-type structure where each of the first conductive impurity region and the second conductive impurity region extends in the second direction, or the ESD device has a ring-type structure where the second conductive impurity region surrounds the first conductive impurity region in a ring shape, or the first conductive impurity region surrounds the second conductive impurity region in a ring shape.

10. The ESD device of claim 1, comprising a gate all around (GAA) structure or a multi-bridge channel (MBC) structure.

11. The ESD device of claim 1, wherein the active region is provided in an upper portion of the well.

12. An electrostatic discharge (ESD) device comprising:
a well formed in a substrate, the well having a first conductive type and a first doping concentration;
a plurality of fins extending in a first direction across the well in a protruding manner from the substrate, the plurality of fins being spaced apart from one another in a second direction perpendicular to the first direction;
a first conductive impurity region formed by doping a portion of each of the plurality of fins with first conductive impurities;
a second conductive impurity region formed by doping a portion of each of the plurality of fins with second conductive impurities having a second conductive type different from to the first conductive type, the second conductive impurity region being disposed apart from the first conductive impurity region in the first direction;
a fin-cut isolation region disposed between the first conductive impurity region and the second conductive impurity region in the first direction in each of the plurality of fins to cut the each of the plurality of fins into at least a first fin portion and a second fin portion;

a plurality of gate lines disposed apart from one another in the first direction to cover a portion of each of the plurality of fins and extend in the second direction; and
a contact contacting each of the first conductive impurity region and the second conductive impurity region,
wherein an active region is formed at an upper portion of the well, the active region having a second doping concentration higher than the first doping concentration, and
wherein a first portion of the active region under the first fin portion and a second portion of the active region under the second fin portion are connected to each other through a third portion of the active region under the fin-cut isolation region.

13. The ESD device of claim 12, wherein one of the first conductive impurity region, the second conductive impurity region, and the fin-cut isolation region is disposed between two gate lines, among the plurality of gate lines, adjacent to each other in the first direction.

14. The ESD device of claim 12, wherein the first conductive type is an N type, and a second conductive type is a P type,
the ESD device has a P-type diode structure or an N-type diode structure, and
the contact is configured to apply one of a source voltage, a signal voltage, or a ground voltage.

15. The ESD device of claim 14, wherein the ESD device has a bar-type structure where each of the first conductive impurity region and the second conductive impurity region extends in the second direction, or
the ESD device has a ring-type structure where the second conductive impurity region surrounds the first conductive impurity region in a ring shape, or the first conductive impurity region surrounds the second conductive impurity region in a ring shape.

16. The ESD device of claim 12, wherein a bottom surface of the fin-cut isolation region corresponds to a top surface of the active region, and
the bottom surface of the fin-cut isolation region is higher than a bottom surface of the active region.

17. An electrostatic discharge (ESD) protection circuit comprising:
at least two ESD devices provided on a substrate; and
a pad provided on the substrate and connected to the at least two ESD devices, and configured to apply a signal voltage to a protection target device protected by the at least two ESD devices, wherein each of the at least two ESD devices comprises:
a well formed in the substrate, the well having a first conductive type and having a first doping concentration;
an active region formed at an upper portion of the substrate, the active region having a second doping concentration higher than the first doping concentration;
a plurality of fins extending in a first direction across the well in a protruding manner from the substrate, the plurality of fins being spaced apart from one another in a second direction perpendicular to the first direction;
a first conductive impurity region formed by doping a portion of each of the plurality of fins with first conductive impurities;
a second conductive impurity region formed by doping a portion of each of the plurality of fins with second conductive impurities having a second conductive type different from the first conductive type, the second conductive impurity region being disposed apart from the first conductive impurity region in the first direction; and a fin-cut isolation region disposed between the first conductive impurity region and the second conductive impurity region in the first direction in each of the plurality of fins to cut each of the plurality of fins into at least a first fin portion and a second fin portion, wherein a bottom surface of the fin-cut isolation region is higher than a bottom surface of the active region.

18. The ESD protection circuit of claim 17, wherein each of the at least two ESD devices further comprises a plurality of gate lines disposed apart from one another in the first direction to cover a portion of each of the plurality of fins and extend in the second direction, each of the first conductive impurity region, the second conductive impurity region, and the fin-cut isolation region is disposed between two gate lines, among the plurality of gate lines, adjacent to each other in the first direction.

19. The ESD protection circuit of claim 17, wherein the at least two ESD devices comprise a first ESD device having a P-type diode structure and a second ESD device having an N-type diode structure, the first ESD device is disposed between the pad and a power terminal to which a source voltage is applied, and the second ESD device is disposed between the pad and a ground terminal to which a ground voltage is applied.

20. The ESD protection circuit of claim 19, wherein the first conductive type is an N type, and a second conductive type is a P type, each of at least two ESD devices further comprises a contact contacting each of the first conductive impurity region and the second conductive impurity region, in the first ESD device, the second conductive impurity region is disposed at a center of each of the plurality of fins and the first conductive impurity region is disposed at both sides of the second conductive impurity region in the first direction, in the second ESD device, the first conductive impurity region is disposed at the center of each of the plurality of fins and the second conductive impurity region is disposed at both the sides of the first conductive impurity region in the first direction, the source voltage is applied to the first conductive impurity region of the first ESD device through the power terminal and the contact, and the signal voltage is applied to the second conductive impurity region of the first ESD device through the pad and the contact, and the signal voltage is applied to the first conductive impurity region of the second ESD device through the pad and the contact, and the ground voltage is applied to the second conductive impurity region of the second ESD device through the ground terminal and the contact.

21. The ESD protection circuit of claim 17, wherein each of the at least two ESD devices has a bar-type structure where each of the first conductive impurity region and the second conductive impurity region extends in the second direction, or each of the at least two ESD devices has a ring-type structure where the second conductive impurity region surrounds the first conductive impurity region in a ring shape, or the first conductive impurity region surrounds the second conductive impurity region in a ring shape, and a first portion of the active region under the first fin portion and a second portion of the active region under the second fin portion are connected to each other through a third portion of the active region under the fin-cut isolation region.

* * * * *